US012635284B2

(12) United States Patent
Lee et al.

(10) Patent No.: US 12,635,284 B2
(45) Date of Patent: May 19, 2026

(54) SOLAR CELL AND METHOD OF MANUFACTURING THE SAME

(71) Applicant: JINGAO SOLAR CO., LTD, Xingtai (CN)

(72) Inventors: Daeyong Lee, Seoul (KR); Jonghwan Kim, Seoul (KR); Hyungjin Kwon, Seoul (KR)

(73) Assignee: JINGAO SOLAR CO., LTD, Xingtai (CN)

( * ) Notice: Subject to any disclaimer, the term of this patent is extended or adjusted under 35 U.S.C. 154(b) by 662 days.

(21) Appl. No.: 15/076,111

(22) Filed: Mar. 21, 2016

(65) Prior Publication Data

US 2016/0204300 A1 Jul. 14, 2016

Related U.S. Application Data

(62) Division of application No. 12/566,540, filed on Sep. 24, 2009, now Pat. No. 9,306,084.

(30) Foreign Application Priority Data

Jun. 18, 2009 (KR) ........................ 10-2009-0054472

(51) Int. Cl.
H10F 71/00 (2025.01)
H10F 10/14 (2025.01)
(Continued)

(52) U.S. Cl.
CPC ........... H10F 71/128 (2025.01); H10F 10/14 (2025.01); H10F 77/211 (2025.01);
(Continued)

(58) Field of Classification Search
USPC .................................................. 136/243–293
See application file for complete search history.

(56) References Cited

U.S. PATENT DOCUMENTS 6,071,753 A * 6/2000 Arimoto ........... H01L 31/02168
136/255
7,741,225 B2 6/2010 Rohatgi et al.
(Continued)

FOREIGN PATENT DOCUMENTS

CN 1641888 A 7/2005
CN 101179100 A 5/2008
(Continued)

OTHER PUBLICATIONS

Machine translation of WO 2006/129444, pp. 1-8. (Year: 2006).*

*Primary Examiner* — Thanh Truc Trinh
(74) *Attorney, Agent, or Firm* — Pillsbury Winthrop Shaw Pittman LLP

(57) ABSTRACT

A solar cell and a method of manufacturing the same are disclosed. The solar cell includes a substrate of a first conductive type; an emitter layer of a second conductive type opposite the first conductive type on the substrate; a first electrode electrically connected to the emitter layer; a passivation layer on the substrate; a second electrode conductive layer on the passivation layer, the second electrode conductive layer including at least one second electrode electrically connected to the substrate through the passivation layer; and a second electrode current collector electrically connected to the second electrode conductive layer.

14 Claims, 19 Drawing Sheets

(51) Int. Cl.
    *H10F 77/20*          (2025.01)
    *H10F 77/30*          (2025.01)

(52) U.S. Cl.
    CPC ............ *H10F 77/311* (2025.01); *Y02E 10/52*
               (2013.01); *Y02E 10/547* (2013.01)

(56)               References Cited

U.S. PATENT DOCUMENTS

| | | | |
|---|---|---|---|
| 7,772,486 B2 | 8/2010 | Nakashima et al. | |
| 2002/0148499 A1* | 10/2002 | Tanaka ............ | H01L 31/022425 |
| | | | 136/256 |
| 2004/0097062 A1* | 5/2004 | Preu ........................ | H01L 31/18 |
| | | | 438/795 |
| 2005/0150543 A1 | 7/2005 | Nakashima et al. | |
| 2005/0189015 A1* | 9/2005 | Rohatgi .............. | H01L 31/1804 |
| | | | 136/252 |
| 2005/0268959 A1 | 12/2005 | Aschenbrenner et al. | |
| 2006/0060238 A1 | 3/2006 | Hacke et al. | |
| 2006/0130891 A1* | 6/2006 | Carlson ............. | H01L 31/02168 |
| | | | 136/256 |
| 2006/0273287 A1* | 12/2006 | Young ........................ | C03C 8/10 |
| | | | 252/500 |

| | | | |
|---|---|---|---|
| 2007/0107773 A1 | 5/2007 | Fork et al. | |
| 2007/0137699 A1 | 6/2007 | Manivannan et al. | |
| 2007/0186970 A1 | 8/2007 | Takahashi et al. | |
| 2007/0295381 A1 | 12/2007 | Fujii et al. | |
| 2009/0025786 A1* | 1/2009 | Rohatgi .......... | H01L 31/022425 |
| | | | 136/256 |
| 2009/0325327 A1 | 12/2009 | Rohatgi et al. | |
| 2011/0005582 A1* | 1/2011 | Szlufcik .............. | H01L 31/1804 |
| | | | 136/252 |

FOREIGN PATENT DOCUMENTS

| | | | | | |
|---|---|---|---|---|---|
| JP | 5-63219 | A | 3/1993 | | |
| JP | 5-110122 | A | 4/1993 | | |
| JP | 10-4204 | A | 1/1998 | | |
| JP | 11-284212 | A | 10/1999 | | |
| JP | 2008-34609 | A | 2/2008 | | |
| JP | 2008-135565 | A | 6/2008 | | |
| KR | 10-2010-0130931 | A | 12/2010 | | |
| WO | WO 2006/097303 | * | 9/2006 | ............. | H01L 31/18 |
| WO | WO 2006/129444 | * | 12/2006 | | |
| WO | WO 2010/147260 | A1 | 12/2010 | | |
| WO | WO 2010/150943 | A1 | 12/2010 | | |

* cited by examiner

SOLAR CELL AND METHOD OF MANUFACTURING THE SAME

CROSS-REFERENCE TO RELATED APPLICATIONS

This Application is a Divisional of U.S. patent application Ser. No. 12/566,540 filed on Sep. 24, 2009 (now U.S. Pat. No. 9,306,084 issued on Apr. 5, 2016), which claims the benefit under 35 U.S.C. § 119(a) to Korean Patent Application No. 10-2009-0054472 filed on Jun. 18, 2009, all of which are hereby expressly incorporated by reference into the present application

BACKGROUND OF THE INVENTION

Field of the Invention

Embodiments relate to a solar cell and a method of manufacturing the same.

Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A general solar cell includes a substrate and an emitter layer, formed of a semiconductor, each having a different conductive type such as a p-type and an n-type, and electrodes respectively formed on the substrate and the emitter layer. The general solar cell also includes a p-n junction formed at an interface between the substrate and the emitter layer.

When light is incident on the solar cell, a plurality of electron-hole pairs are generated in the semiconductor. Each of the electron-hole pairs is separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain an electric power.

SUMMARY OF THE INVENTION

Embodiments provide a solar cell capable of improving an operation efficiency.

Embodiments also provide a method of manufacturing a solar cell capable of reducing manufacturing time and the number of manufacturing processes.

In one aspect, there is a solar cell comprising a substrate of a first conductive type, an emitter layer of a second conductive type opposite the first conductive type on the substrate, a first electrode electrically connected to the emitter layer, a passivation layer on the substrate, a second electrode conductive layer on the passivation layer, the second electrode conductive layer including at least one second electrode electrically connected to the substrate, and a second electrode current collector electrically connected to the second electrode conductive layer.

The second electrode conductive layer and the second electrode current collector may be positioned on the same level layer.

The second electrode conductive layer partially may overlap the second electrode current collector.

An overlap size between the second electrode conductive layer and the second electrode current collector may be approximately 0.1 mm to 1 mm.

The second electrode current collector may be positioned on a portion of the second electrode conductive layer.

The second electrode conductive layer may be positioned on a portion of the second electrode current collector.

The second electrode conductive layer may contain aluminum (Al), and the second electrode current collector may contain silver (Ag).

The second electrode conductive layer may contain lead (Pb).

The passivation layer may be positioned opposite the first electrode with the substrate interposed between the passivation layer and the first electrode.

The passivation layer may include at least one layer.

The solar cell may further comprise at least one back surface field (BSF) layer between the second electrode and the substrate.

The second electrode current collector may be positioned on the passivation layer.

The second electrode current collector may be positioned on the second electrode conductive layer on the passivation layer.

The second electrode current collector may be positioned on the passivation layer on which the second electrode is not formed.

The second electrode current collector may be formed in a stripe form.

A number of second electrode current collectors may be two.

A width of the second electrode current collector may be greater than a width of the second electrode.

In another aspect, there is a solar cell module comprising a plurality of solar cells each including an emitter layer of a conductive type opposite a conductive type of a substrate on the substrate, a first electrode electrically connected to the emitter layer, a first electrode current collector electrically connected to the first electrode, a passivation layer on the substrate, a second electrode conductive layer that is positioned on the passivation layer and includes at least one second electrode electrically connected to the substrate, and a second electrode current collector electrically connected to the second electrode conductive layer, and a plurality of conductive connectors that are positioned on the first electrode current collector and the second electrode current collector in each of the plurality of solar cells to electrically connect the first electrode current collector to a second electrode current collector.

Each of the conductive connectors may be a conductive tape.

In another aspect, there is a method of manufacturing a solar cell comprising forming an emitter layer of a second conductive type opposite a first conductive type on a substrate of the first conductive type, removing a portion of the emitter layer to expose a portion of the substrate, stacking a passivation layer on the exposed portion of the substrate, coating a first paste on the emitter layer to form a first electrode pattern, coating a second paste and a third paste on the passivation layer to form a second electrode conductive layer pattern and a second electrode current collector pattern so that the second electrode conductive layer pattern and the second electrode current collector pattern overlap each other, performing a thermal process on a portion of the second electrode conductive layer pattern to bring the portion of the second electrode conductive layer pattern into contact with a portion of the substrate, and performing a thermal process on the first electrode pattern, the second electrode conductive layer pattern, and the second electrode current collector pattern to form a plurality of first electrodes electrically connected to the emitter layer and a second electrode conductive layer including a plurality of second electrodes electrically connected to the substrate.

The forming of the second electrode conductive layer pattern and the second electrode current collector pattern may comprise coating the second paste on a portion of the passivation layer using a screen printing method to form the second electrode conductive layer pattern and then coating the third paste on a portion of the passivation layer and a portion of the second electrode conductive layer pattern using the screen printing method to form the second electrode current collector pattern.

The second paste may contain aluminum (Al), and the third paste may contain silver (Ag).

The forming of the second electrode conductive layer pattern and the second electrode current collector pattern may comprise coating the second paste on a portion of the passivation layer using a screen printing method to form the second electrode current collector pattern and then coating the third paste on a portion of the passivation layer and a portion of the second electrode current collector pattern using the screen printing method to form the second electrode conductive layer pattern.

The second paste may contain silver (Ag), and the third paste may contain aluminum (Al).

In another aspect, there is a method of manufacturing a solar cell comprising forming an emitter layer of a second conductive type opposite a first conductive type on a substrate of the first conductive type, removing a portion of the emitter layer to expose a portion of the substrate, stacking a passivation layer on the exposed portion of the substrate, removing a portion of the passivation layer to form an exposing portion exposing a portion of the substrate, coating a first paste on the emitter layer to form a first electrode pattern, coating a second paste and a third paste on the passivation layer and the exposed portion of the substrate to form a second electrode conductive layer pattern and a second electrode current collector pattern so that the second electrode conductive layer pattern and the second electrode current collector pattern overlap each other, performing a thermal process on the first electrode pattern, the second electrode conductive layer pattern, and the second electrode current collector pattern to form a plurality of first electrodes electrically connected to the emitter layer and a second electrode conductive layer including a plurality of second electrodes electrically connected to the substrate.

The forming of the second electrode conductive layer pattern and the second electrode current collector pattern may comprise coating the second paste on a portion of the passivation layer and the exposed portion of the substrate exposed by the exposing portions using a screen printing method to form the second electrode conductive layer pattern and then coating the third paste on a portion of the passivation layer and a portion of the second electrode conductive layer pattern using the screen printing method to form the second electrode current collector pattern.

The second paste may contain aluminum (Al), and the third paste may contain silver (Ag).

The forming of the second electrode conductive layer pattern and the second electrode current collector pattern may comprise coating the second paste on a portion of the passivation layer using a screen printing method to form the second electrode current collector pattern and then coating the third paste on a portion of the passivation layer, the exposed portion of the substrate exposed by the exposing portions, and a portion of the second electrode current collector pattern using the screen printing method to form the second electrode conductive layer pattern.

The second paste may contain silver (Ag), and the third paste may contain aluminum (Al).

The forming of the exposing portions may comprise irradiating a laser beam on a portion of the passivation layer to expose a portion of the substrate.

In another aspect, there is a method of manufacturing a solar cell comprising forming an emitter layer of a second conductive type opposite a first conductive type on a substrate of the first conductive type, forming a passivation layer on the substrate having the emitter layer, forming an auxiliary passivation layer on the passivation layer formed on a rear surface of the substrate, forming a first electrode pattern on the passivation layer formed on a front surface of the substrate, forming a second electrode conductive layer pattern on the auxiliary passivation layer, and performing a thermal process on the first electrode pattern and the second electrode conductive layer pattern to form a plurality of first electrodes electrically connected to the emitter layer and a second electrode conductive layer including a plurality of second electrodes electrically connected to the substrate.

The forming of the emitter layer may use a spray method or a spin coating method.

The forming of the emitter layer may comprise forming the emitter layer on the front surface and a side surface of the substrate.

The forming of the passivation layer may use a thermal oxidation method.

The passivation layer may be formed of silicon oxide.

The method may further comprise forming an anti-reflection layer on the passivation layer formed on the front surface of the substrate.

The forming of the anti-reflection layer may use a plasma enhanced chemical vapor deposition (PECVD) method.

The anti-reflection layer may be formed of silicon nitride.

The forming of the auxiliary passivation layer may use a plasma enhanced chemical vapor deposition (PECVD) method.

The auxiliary passivation layer may be formed of silicon nitride.

The forming of the second electrode conductive layer pattern may comprise forming a second electrode conductive layer pattern on the auxiliary passivation layer using a screen printing method, and irradiating a laser beam onto at least a portion of the second electrode conductive layer pattern to form a plurality of second electrode portions formed of a mixture of components of the second electrode conductive layer pattern, the auxiliary passivation layer, and the substrate, wherein the plurality of second electrode portions may become the plurality of second electrodes by performing a thermal process on the second electrode conductive layer pattern, and a second electrode conductive layer including the plurality of second electrodes is formed using the second electrode conductive layer pattern.

The forming of the second electrode conductive layer pattern may comprise irradiating a laser beam onto at least a portion of the auxiliary passivation layer and at least a portion of the passivation layer to form a plurality of exposing portions exposing a portion of the substrate, and forming a second electrode conductive layer pattern on a portion of the auxiliary passivation layer and the exposed portion of the substrate using a screen printing method, wherein a thermal process is performed on the second electrode conductive layer pattern to form a second electrode conductive layer including a plurality of second electrodes electrically connected to the substrate through the exposing portions.

The method may further comprise injecting impurities of the first conductive type into at least a portion of the substrate to form a plurality of impurity regions each having a concentration greater than a concentration of the first conductive type impurities, wherein the plurality of second electrodes may be electrically connected to the substrate through the plurality of impurity regions.

The forming of the plurality of impurity regions may comprise forming the plurality of exposing portions and then injecting the first conductive type impurities into at least a portion of the substrate through the plurality of exposing portions using the passivation layer as a mask.

In another aspect, there is a solar cell including a substrate of a first conductive type; an emitter layer of a second conductive type opposite the first conductive type on the substrate; a first electrode electrically connected to the emitter layer; a passivation layer on the substrate; a second electrode conductive layer on the passivation layer, the second electrode conductive layer including at least one second electrode electrically connected to the substrate through the passivation layer; and a second electrode current collector electrically connected to the second electrode conductive layer.

In another aspect, there is a solar cell module including a plurality of solar cells each including an emitter layer of a conductive type opposite a conductive type of a substrate on the substrate, a first electrode electrically connected to the emitter layer, a first electrode current collector electrically connected to the first electrode, a passivation layer on the substrate, a second electrode conductive layer that is positioned on the passivation layer and includes at least one second electrode electrically connected to the substrate through the passivation layer, and a second electrode current collector electrically connected to the second electrode conductive layer; and a plurality of conductive connectors, each of which is positioned on the first electrode current collector of one of the plurality of solar cells and the second electrode current collector of another of the plurality of solar cells to electrically connect the first electrode current collector of the one of the plurality of solar cells to a second electrode current collector of the another of the plurality of solar cells.

In another aspect, there is a method of manufacturing a solar cell including forming an emitter layer of a second conductive type opposite a first conductive type on a substrate of the first conductive type; removing a portion of the emitter layer to expose a portion of the substrate; forming a passivation layer on the exposed portion of the substrate; forming a first electrode electrically connected to the emitter layer; forming a second electrode conductive layer on the passivation layer, the second electrode conductive layer including at least one second electrode electrically connected to the substrate through the passivation layer; and forming a second electrode current collector electrically connected to the second electrode conductive layer.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
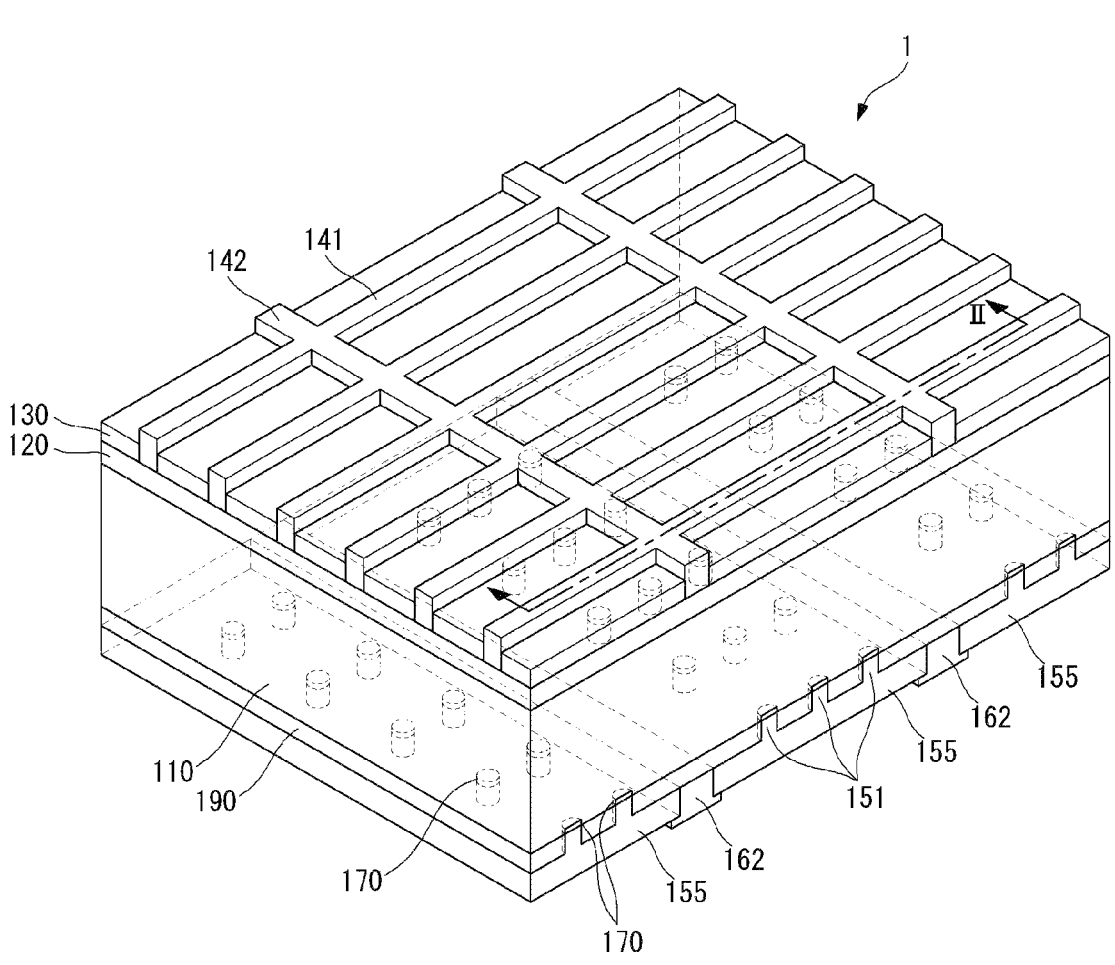
FIG. 1 is a partial perspective view of a solar cell according to an example embodiment.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 2:
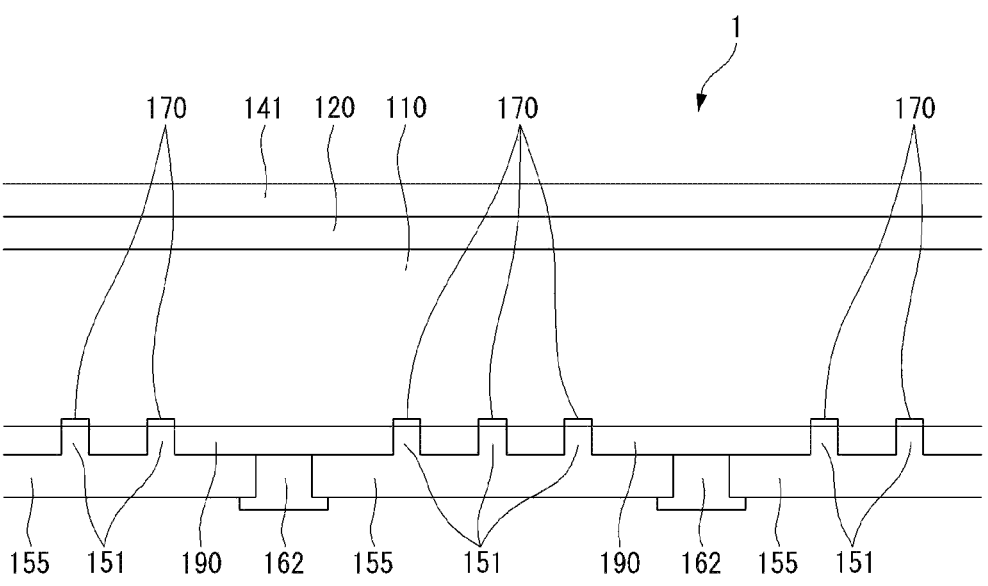
FIG. 2 is a cross-sectional view taken along line II-II of FIG. 1.

FIG. 1 is a partial perspective view of a solar cell according to an example embodiment. FIG. 2 is a cross-sectional view taken along line II-II of FIG. 1. As shown in FIG. 1, a solar cell 1 according to an embodiment includes a substrate 110, an emitter layer 120 on an incident surface (hereinafter, referred to as "a front surface") of the substrate 110, on which light is incident, an anti-reflection layer 130 on the emitter layer 120, a passivation layer 190 on a rear surface of the substrate 110 opposite the front surface of the substrate 110, a plurality of front electrodes 141 electrically connected to the emitter layer 120, a plurality of front electrode current collectors 142, a rear electrode conductive layer 155, a plurality of rear electrode current collectors 162, and a plurality of back surface field (BSF) layers 170. The plurality of front electrode current collectors 142 are connected to the plurality of front electrodes 141 and extend in a cross direction of the front electrode current collectors 142 and the front electrodes 141. The rear electrode conductive layer 155 is positioned on the passivation layer 190 and includes a plurality of rear electrodes 151 electrically connected to the substrate 110. The plurality of rear electrode current collectors 162 are positioned on the passivation layer 190 and are electrically connected to the rear electrode conductive layer 155. The plurality of BSF layers 170 are positioned between the substrate 110 and the plurality of rear electrodes 151.

In the example embodiment, the substrate 110 may be formed of silicon doped with impurities of a first conductive type, for example, a p-type, though not required. Examples of silicon include single crystal silicon, polycrystalline silicon, and amorphous silicon. When the substrate 110 is of a p-type, the substrate 110 contains impurities of a group III element such as boron (B), gallium (Ga), and Indium (In). Alternatively, the substrate 110 may be of an n-type, and/or be made of other materials than silicon. When the substrate 110 is of the n-type, the substrate 110 may contain impurities of a group V element such as phosphor (P), arsenic (As), and antimony (Sb). Unlike the configuration illustrated in FIGS. 1 and 2, the surface of the substrate 110 may be textured to form a textured surface corresponding to an uneven surface.

The emitter layer 120 is an impurity portion having a second conductive type (for example, an n-type) opposite the first conductive type of the substrate 110. The emitter layer 120 and the substrate 110 form a p-n junction.

A plurality of electron-hole pairs produced by light incident on the substrate 110 are separated into electrons and holes by a built-in potential difference resulting from the p-n junction. Then, the separated electrons move toward the n-type semiconductor, and the separated holes move toward the p-type semiconductor. Thus, when the substrate 110 is of the p-type and the emitter layer 120 is of the n-type, the separated holes and the separated electrons move to the substrate 110 and the emitter layer 120, respectively. Accordingly, the holes in the substrate 110 and the electrons in the emitter layer 120 become major carriers.

Because the substrate 110 and the emitter layer 120 form the p-n junction, the emitter layer 120 may be of the p-type when the substrate 110 is of the n-type unlike the embodiment described above. In this case, the separated electrons and the separated holes move to the substrate 110 and the emitter layer 120, respectively.

Returning to the embodiment when the emitter layer 120 is of the n-type, the emitter layer 120 may be formed by doping the substrate 110 with impurities of a group V element such as P, As, and Sb. On the contrary, when the emitter layer 120 is of the p-type, the emitter layer 120 may be formed by doping the substrate 110 with impurities of a group III element such as B, Ga, and In.

The anti-reflection layer 130 formed of silicon nitride (SiNx) and/or silicon oxide (SiO$_x$) is positioned on the emitter layer 120. The anti-reflection layer 130 reduces a reflectance of light incident on the substrate 110 and increases a selectivity of a predetermined wavelength band, thereby increasing the efficiency of the solar cell 1. The anti-reflection layer 130 may have a thickness of about 80 nm to 100 nm. The anti-reflection layer 130 may be omitted, if desired.

The passivation layer 190 is positioned on the rear surface of the substrate 110 to reduce a recombination of charges around the surface of the substrate 110 and to increase an inner reflectance of light passing through the substrate 110. Hence, a re-incidence of the light passing through the substrate 110 can increase. The passivation layer 190 has a single-layered structure or a multi-layered structure.

The front electrodes 141 are positioned on the emitter layer 120, are electrically connected to the emitter layer 120, and extend in a fixed direction to be spaced apart from one another. The front electrodes 141 collect charges (for example, electrons) moving to the emitter layer 120 and transfer the collected charges to the front electrode current collectors 142.

The front electrode current collectors 142 are positioned on the same level layer as the first electrodes 141 on the emitter layer 120 and extend in the cross direction of the front electrode current collectors 142 and the front electrodes 141. The front electrode current collectors 142 and the first electrodes 141 may be coplanar. Also, the front electrode current collectors 142 and the first electrodes 141 may be the same level layer as being formed on the emitter layer 120, but have different thicknesses, such that the exposed surfaces of the front electrode current collectors 142 and the first electrodes 141 are not coplanar, and the respective thicknesses relative to the emitter layer 120 are different. The front electrode current collectors 142 collect the charges transferred from the front electrodes 141 and output the charges to an external device.

The front electrodes 141 and the front electrode current collectors 142 are formed of at least one conductive material. More specifically, the front electrodes 141 and the front electrode current collectors 142 may be formed of at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used.

The rear electrode conductive layer 155 is substantially positioned on the passivation layer 190 in a remaining portion excluding a formation portion of the rear electrode current collectors 162 at the rear surface of the substrate 110. The rear electrode conductive layer 155 may be formed of a conductive material such as Al. Other conductive materials may be used for the rear electrode conductive layer 155. The rear electrode conductive layer 155 includes the plurality of rear electrodes 151 that pass through the passivation layer 190 and are electrically connected to a portion of the substrate 110.

As shown in FIG. 1, the plurality of rear electrodes 151 are spaced apart from one another at a constant distance, for example, at intervals of about 0.5 mm to 1 mm and are electrically connected to the substrate 110. The plurality of rear electrodes 151 may have various shapes such as a circle, an oval, and a polygon. For example, each of the rear electrodes 151 may have the same stripe shape as the front electrodes 141 and thus may extend in one direction. The number of rear electrodes 151 having the stripe shape may be much less than the number of rear electrodes 151 having the circle, oval, or polygon shape, for example.

The rear electrodes 151 collect charges (for example, holes) moving to the substrate 110 and transfer the collected charges to the rear electrode conductive layer 155. The rear electrode conductive layer 155 may be formed of at least one selected from the group consisting of Ni, Cu, Ag, Sn, Zn, In, Ti, Au, and a combination thereof. Other conductive materials may be used.

In the embodiment, a portion of the plurality of rear electrodes 151 contacting the substrate 110 may contain only the same components as the rear electrode conductive layer 155 or may contain a mixture of components of the passivation layer 190 and the substrate 110 as well as components contained in the rear electrode conductive layer 155.

The rear electrode current collectors 162 on the passivation layer 190 extend in the same direction as the front electrode current collectors 142 and thus have a stripe shape. The rear electrode current collectors 162 may be positioned opposite the front electrode current collectors 142 relative to the substrate 110.

In the embodiment, the rear electrode current collectors 162 are positioned on the passivation layer 190, so that the rear electrode current collectors 162 do not overlap the rear electrodes 151. In other words, as shown in FIGS. 1 and 2, the rear electrode current collectors 162 are positioned on the passivation layer 190 on which the rear electrodes 151 are not positioned, but are not limited thereto.

In the embodiment, FIG. 1 shows the two rear electrode current collectors 162. However, the number of rear electrode current collectors 162 may be two (2) or less or three (3) or more. The number of rear electrode current collectors 162 may vary depending on the size of the substrate 110. The rear electrode current collectors 162 may be formed of a plurality of circle or polygon conductors that are positioned to be spaced apart from one another at a constant distance, but such is not required.

The rear electrode current collectors 162 collect charges (for example, holes) transferred from the rear electrodes 151 through the rear electrode conductive layer 155 and output the collected charges to an external device. Because the rear electrode current collectors 162 are designed so that a width of each of the rear electrode current collectors 162 is greater than a width of each of the rear electrodes 151, a transfer efficiency of the charges can be improved and an operation efficiency of the solar cell 1 can be improved. The rear electrode current collectors 162 may be formed of one conductive material such as Ag. Other materials may be used.

The rear electrode current collectors 162 are positioned on a portion of the rear electrode conductive layer 155 and overlap the rear electrode conductive layer 155. In the embodiment, an overlap size between the rear electrode current collectors 162 and the rear electrode conductive layer 155 is approximately 0.1 mm to 1 mm. Accordingly, because a contact resistance between the rear electrode current collectors 162 and the rear electrode conductive layer 155 is reduced, a contact efficiency increases. Further, a charge transfer efficiency from the rear electrode conductive layer 155 is improved. Additionally, as shown in FIG. 1, a thickness of the rear electrode current collector 162 is greater than a thickness of the rear electrode conductive layer 155 with respect to a bottom surface (the surface contacting the rear electrode current collector 162) of the passivation layer 190.

In the embodiment, the rear electrode current collectors 162 contain Ag, so that the rear electrode current collectors 162 have more excellent charge transfer efficiency than the rear electrode conductive layer 155. Accordingly, when the overlap size between the rear electrode current collectors 162 and the rear electrode conductive layer 155 is greater than approximately 1 mm, a consumed amount of Ag, that is more expensive than Al, in the rear electrode current collectors 162 increases as compared with Al. This results in an increase in the manufacturing cost of the solar cell 1.

The rear electrode current collectors 162 may be formed of at least one selected from the group consisting of Ni, Cu, Al, Sn, Zn, In, Ti, Au, and a combination thereof. Other conductive materials may be used.

The plurality of BSF layers 170 are positioned between the rear electrodes 151 and the substrate 110. The BSF layers 170 are an area (for example, a p+-type area) that is more heavily doped with impurities of the same conductive type as the substrate 110 than the substrate 110. The smooth movement of electrons to the rear surface of the substrate 110 is disturbed by a potential barrier resulting from a difference between impurity doping concentrations of the substrate 110 and the BSF layer 170. Accordingly, the BSF layers 170 prevent or reduce a recombination and/or a disappearance of the electrons and holes in an interface of the substrate 110 and the rear electrodes 151.

In the solar cell 1 according to the embodiment having the above-described structure, the passivation layer 190 is positioned on the rear surface of the substrate 110 to reduce the recombination and/or the disappearance of the charges resulting from unstable bonds existing in the surface of the substrate 110. An operation of the solar cell 1 will be below described in detail.

When light irradiated to the solar cell 1 is incident on the substrate 110 through the anti-reflection layer 130 and the emitter layer 120, a plurality of electron-hole pairs are generated in the substrate 110 by light energy based on the incident light. Hence, a reflection loss of light incident on the substrate 110 is reduced by the anti-reflection layer 130, and thus an amount of light incident on the substrate 110 further increases.

The electron-hole pairs are separated by the p-n junction of the substrate 110 and the emitter layer 120, and the separated electrons move to the n-type emitter layer 120 and the separated holes move to the p-type substrate 110. The electrons moving to the n-type emitter layer 120 are collected by the front electrodes 141 and then are transferred to the front electrode current collectors 142. The holes moving to the p-type substrate 110 are collected by the rear electrode 151 and then are transferred to the rear electrode current collectors 162. When the front electrode current collectors 142 are connected to the rear electrode current collectors 162 using electric wires (not shown), current flows therein to thereby enable use of the current for electric power.

In the embodiment, because the passivation layer 190 is positioned between the substrate 110 and the rear electrode conductive layer 155, the recombination and/or the disappearance of the charges resulting from unstable bonds existing in the surface of the substrate 110 are reduced and the operation efficiency of the solar cell 1 is improved.

Figure 3A:
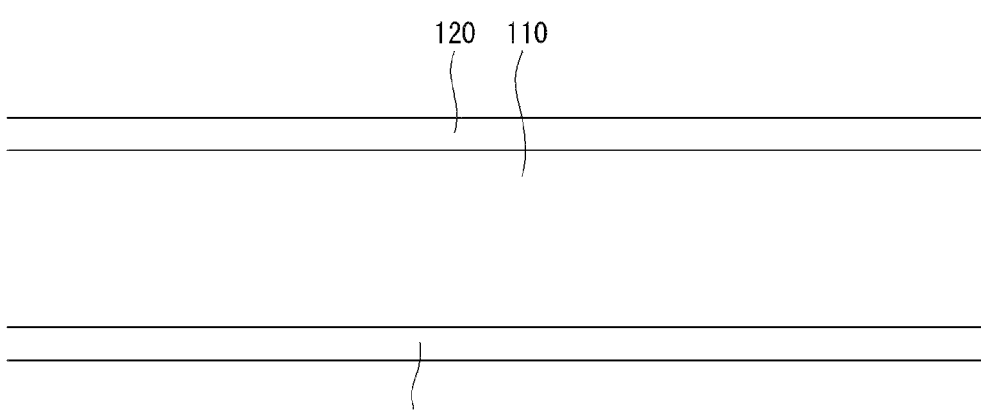
FIGS. 3A to 3H are cross-sectional views sequentially illustrating each of stages in a method of manufacturing a solar cell according to an example embodiment.

FIGS. 3A to 3H are cross-sectional views sequentially illustrating each of stages in a method of manufacturing a solar cell according to an example embodiment. First, as shown in FIG. 3A, a high temperature thermal process of a material (for example, POCl$_3$ or H$_3$PO$_4$) containing impurities of a group V element such as P, As, and Sb is performed on a substrate 110 formed of p-type single crystal silicon or p-type polycrystalline silicon to distribute the group V element impurities on the substrate 110. Hence, an emitter layer 120 is formed on the entire surface of the substrate 110 including a front surface, a rear surface, and a side surface. Unlike the embodiment, when the substrate 110 is of an n-type, a high temperature thermal process of a material (for example, $B_2H_6$) containing group III element impurities is performed on the substrate 110 or the material containing the group III element impurities is stacked on the substrate 110 to form the p-type emitter layer 120 on the entire surface of the substrate 110. Subsequently, phosphorous silicate glass (PSG) containing phosphor (P) or boron silicate glass (BSG) containing boron (B) produced when p-type impurities or n-type impurities are distributed inside the substrate 110 is removed through an etching process.

If necessary, before the emitter layer 120 is formed, a texturing process may be performed on the entire surface of the substrate 110 to form a textured surface of the substrate 110. When the substrate 110 is formed of single crystal silicon, the texturing process may be performed using a basic solution such as KOH and NaOH. When the substrate 110 is formed of polycrystalline silicon, the texturing process may be performed using an acid solution such as HF and $HNO_3$.

Figure 3B:
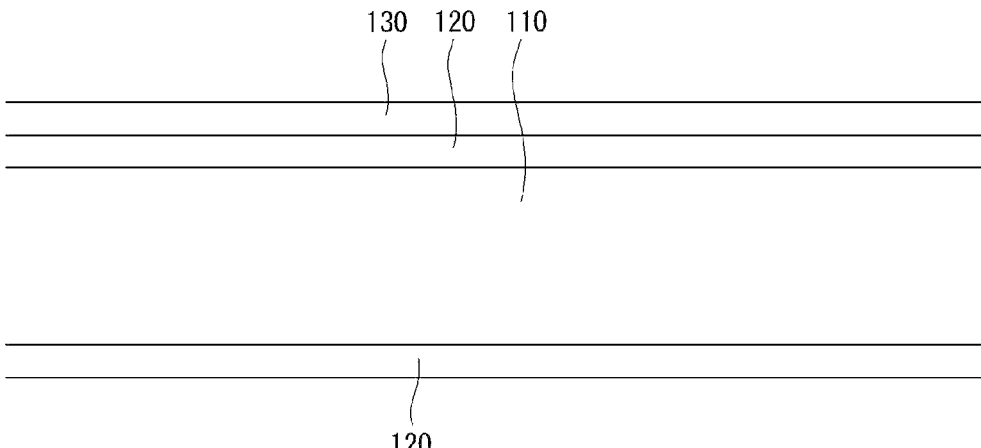

As shown in FIG. 3B, an anti-reflection layer 130 is formed on the substrate 110 using a chemical vapor deposition (CVD) method such as a plasma enhanced chemical vapor deposition (PECVD) method. In addition, the anti-reflection layer 130 may be formed inside the via holes 181, to be shown later.

Figure 3C:
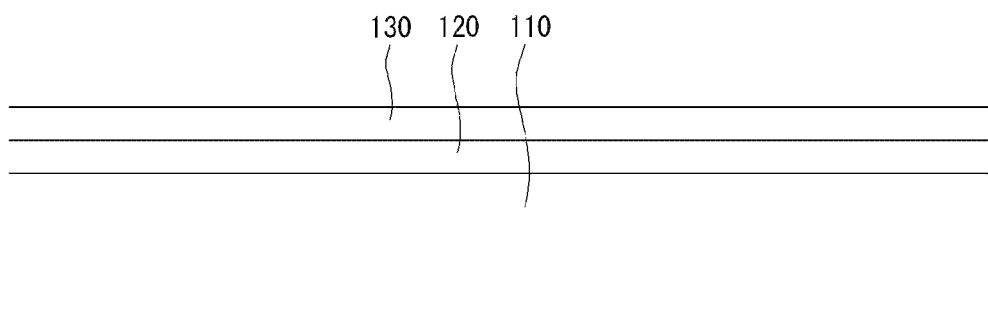

As shown in FIG. 3C, a portion of the rear surface of the substrate 110 is removed using a wet or dry etching method, and thus a portion of the emitter layer 120 on the rear surface of the substrate 110 is removed.

Figure 3D:
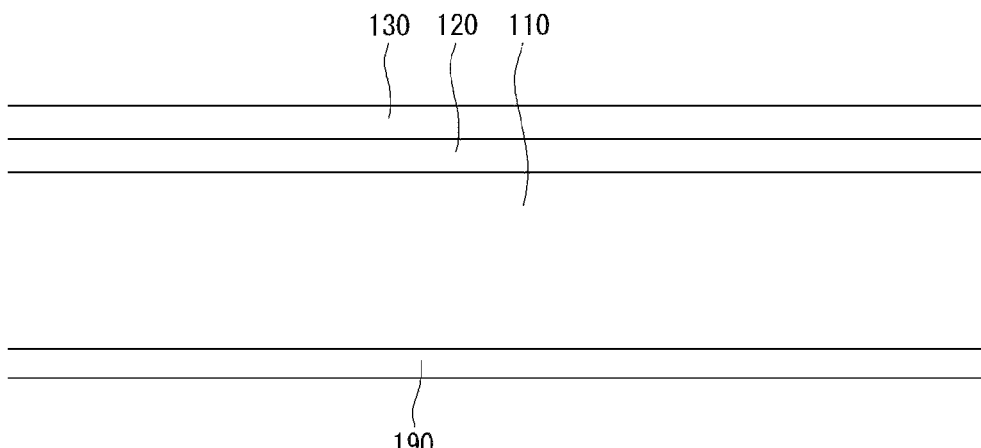

As shown in FIG. 3D, a passivation layer 190 is formed on the rear surface of the substrate 110 using the CVD method such as the PECVD method, a sputtering method, etc. The passivation layer 190 may have a single-layered structure including a silicon oxide ($SiO_x$) layer or a multi-layered structure including a silicon oxide ($SiO_x$) layer and a silicon nitride ($SiN_x$) layer.

Figure 3E:
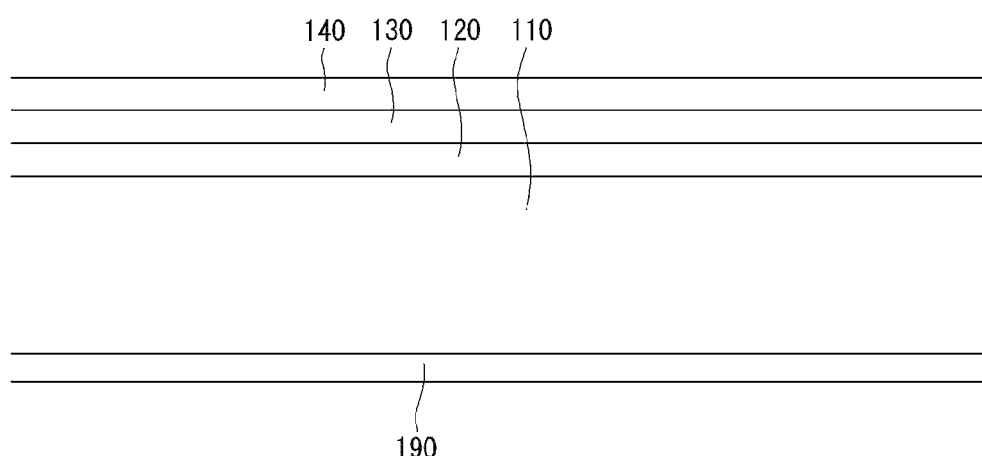

As shown in FIG. 3E, a paste containing Ag is coated on a corresponding portion of the anti-reflection layer 130 using a screen printing method and then is dried at about 120° C. to 200° C. to form a front electrode and front electrode current collector pattern 140. The front electrode and front electrode current collector pattern 140 includes a front electrode pattern and a front electrode current collector pattern that cross each other and extend in a cross direction thereof. In the embodiment, a width of the front electrode current collector pattern may be greater than a width of the front electrode pattern. Other width relationships between the front electrode current collector pattern and the front electrode pattern may be used.

Figure 3F:
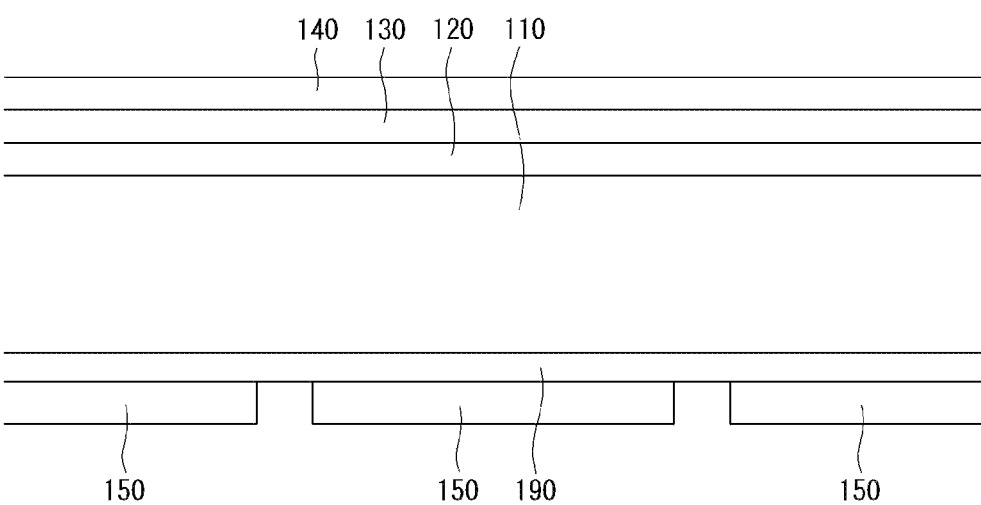

Next, as shown in FIG. 3F, a paste containing Al is coated on a corresponding portion of the passivation layer 190 using the screen printing method and then is dried at about 120° C. to 200° C. to form a rear electrode conductive layer pattern 150. The front electrode and front electrode current collector pattern 140 contains Pb, and the rear electrode conductive layer pattern 150 does not contain Pb.

Figure 3G:
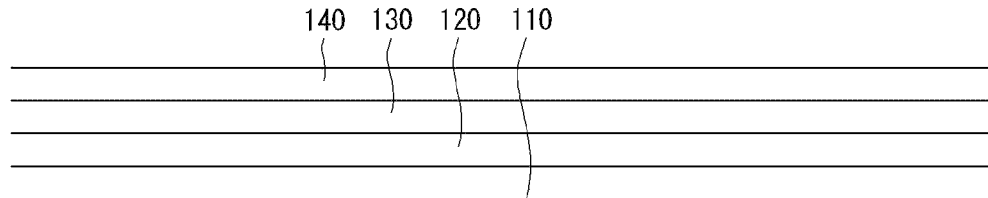
Figure 3G:
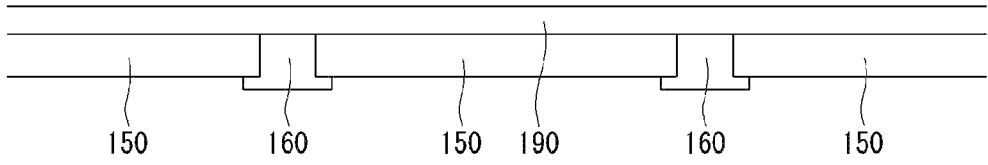

Next, as shown in FIG. 3G, a paste containing Ag is coated on a corresponding portion of the passivation layer 190 using the screen printing method and then is dried at about 120° C. to 200° C. to form a plurality of rear electrode current collector patterns 160. The rear electrode current collector patterns 160 are positioned on a portion of the rear electrode conductive layer pattern 150 and thus partially overlap the rear electrode conductive layer pattern 150.

In the embodiment, the rear electrode current collector patterns 160 are spaced apart from one another and extend in one direction. In addition, the circle or polygon rear electrode current collector patterns 160 may be spaced apart from one another at a constant distance in one direction. The rear electrode conductive layer pattern 150 may be formed prior to the front electrode and front electrode current collector pattern 140.

Figure 3H:
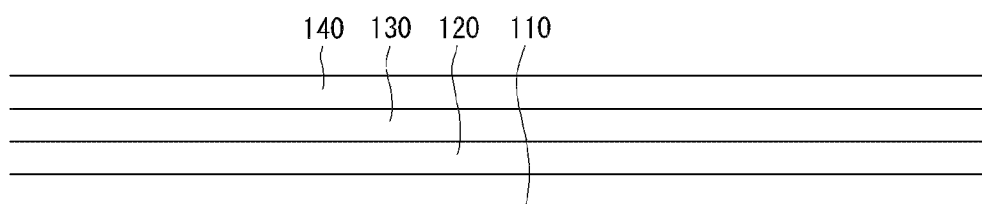
Figure 3H:
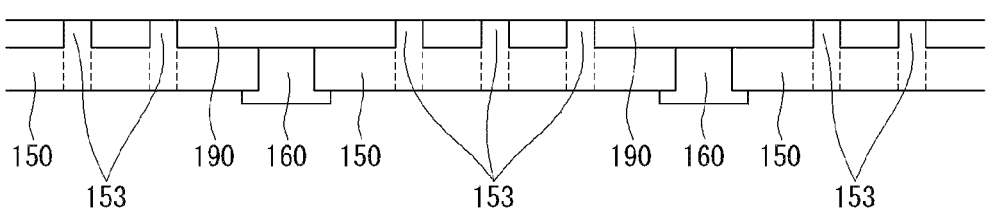

Next, as shown in FIG. 3H, a laser beam is irradiated onto a fixed portion of the rear electrode conductive layer pattern 150 to form a molten mixture 153 of components of the rear electrode conductive layer pattern 150, the passivation layer 190, and the substrate 110. If the rear electrodes 151 have a stripe shape, an irradiation area of the laser beam has a stripe shape extending in a fixed direction. A wavelength and an intensity of the laser beam used may be determined depending on a thickness, a material, etc., of each of the rear electrode conductive layer pattern 150 and the passivation layer 190.

Afterwards, a firing process is performed on the substrate 110, on which the rear electrode conductive layer pattern 150, the plurality of rear electrode current collector patterns 160, and the front electrode and front electrode current collector pattern 140 are formed, at a temperature of about 750° C. to 800° C. to form a plurality of front electrodes 141, a plurality of front electrode current collectors 142, a rear electrode conductive layer 155 including a plurality of rear electrodes 151, a plurality of rear electrode current collectors 162, and a plurality of BSF layers 170. As a result, the solar cell 1 shown in FIGS. 1 and 2 is completed.

More specifically, when the thermal process is performed, the plurality of front electrodes 141 and the plurality of front electrode current collectors 142, that pass through the anti-reflection layer 130 of contact portions and contact the emitter layer 120, are formed due to an element such as Pb contained in the front electrode and front electrode current collector pattern 140. In addition, the molten mixtures 153 contact the substrate 110 to form the plurality of rear electrodes 151. Hence, the rear electrode conductive layer 155 including the rear electrodes 151 is completed. Furthermore, metal components contained in each of the patterns 140, 150, and 160 chemically couples with the layers 120 and 110, and thus a contact resistance is reduced to improve a current flow. As described above, because the rear electrode conductive layer pattern 150 does not contain Pb, the rear electrode conductive layer pattern 150 does not pass through the passivation layer 190 underlying the rear electrode conductive layer pattern 150. In other words, the front electrodes 141 and the front electrode current collectors 142 contain Pb, and the rear electrode conductive layer 155 does not contain Pb.

As described above, because portions of the rear electrode current collector pattern 160 are positioned on the rear electrode conductive layer pattern 150, the formed rear electrode current collectors 162 are positioned on the rear electrode conductive layer 155. Hence, contact areas between the formed rear electrode current collectors 162 and the external device increase because of an increase in areas of the rear electrode current collectors 162. Accordingly, the charge transfer efficiency to the external device is improved.

In the embodiment, the rear electrode current collector pattern 160 may be designed, so that a width of the rear electrode current collector pattern 160 is greater than a distance between adjacent portions of the rear electrode conductive layer pattern 150 facing with respect to the rear electrode current collector pattern 160 because of an overlap between the patterns 150 and 160. Accordingly, the rear electrode current collector pattern 160 having a desired contact area between the rear electrode current collector pattern 160 and the external device while a contact area between the rear electrode current collector pattern 160 and the passivation layer 190 decreases may be designed by adjusting an overlap size between the patterns 150 and 160. Hence, because the contact area between the rear electrode current collector pattern 160 and the passivation layer 190 decreases, a damage area of the passivation layer 190 resulting from a glass frit contained in the rear electrode current collector pattern 160 during the thermal process decreases, and operation characteristics of the passivation layer 190 are improved.

Further, during the thermal process, Al contained in the rear electrodes 151 is distributed to the substrate 110 contacting the rear electrodes 151 to form the plurality of BSF layers 170 between the rear electrodes 151 and the substrate 110. In this case, the BSF layers 170 are an area doped with impurities of the same conductive type as the substrate 110, for example, p-type impurities. An impurity doping concentration of the BSF layers 170 is greater than an impurity doping concentration of the substrate 110, and thus the BSF layers 170 are a p+-type area.

Another method of manufacturing a solar cell according to an example embodiment will be described below with reference to FIGS. 4A to 4C as well as FIGS. 3A to 3E. In the following explanations, structural elements having the same functions and structures as those illustrated in FIGS. 3A to 3H are designated by the same reference numerals, and a further description may be briefly made or may be entirely omitted.

Figure 4A:
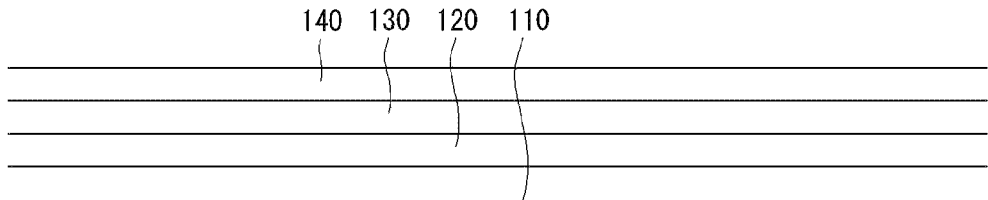
FIGS. 4A to 4C are cross-sectional views sequentially illustrating each of stages in another method of manufacturing a solar cell according to an example embodiment.
Figure 4A:
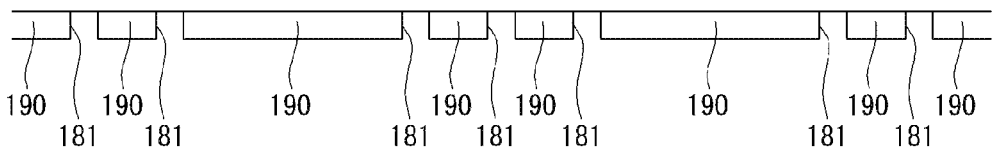
Figure 4B:
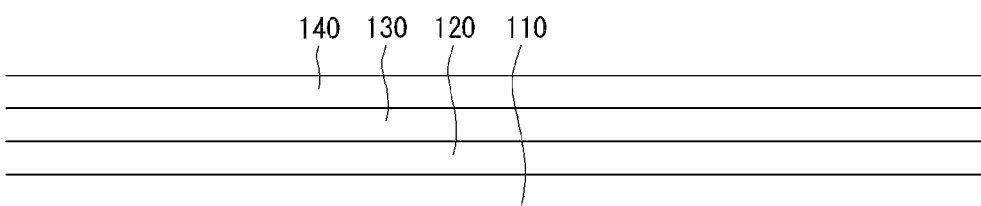
Figure 4B:
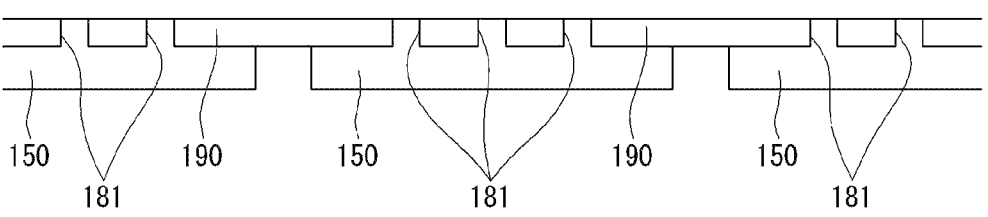
Figure 4C:
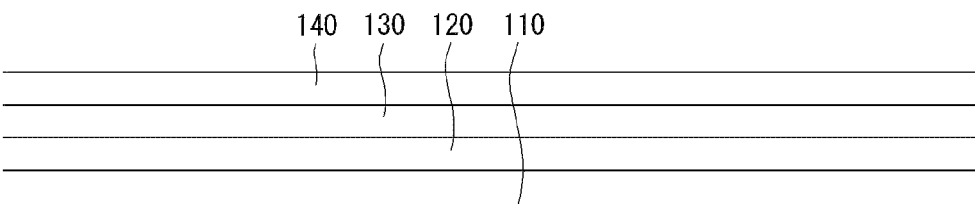
Figure 4C:
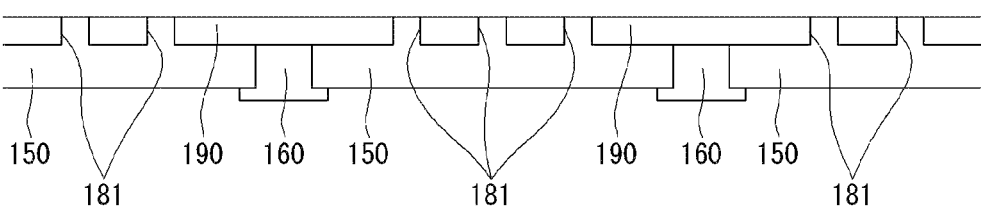

FIGS. 4A to 4C are cross-sectional views sequentially illustrating each of stages in another method of manufacturing a solar cell according to an example embodiment.

As described above with reference to FIGS. 3A to 3E, the passivation layer 190 having a single-layered structure or a multi-layered structure is formed by sequentially forming the emitter layer 120 and the anti-reflection layer 130 on the substrate 110 and then by removing the emitter layer 120 formed on the rear surface of the substrate 110. Then, the front electrode and front electrode current collector pattern 140 is formed on the anti-reflection layer 130.

Next, as shown in FIG. 4A, a laser beam is irradiated onto a corresponding portion of the passivation layer 190 to form a plurality of exposing portions 181 exposing portions of the substrate 110 on the passivation layer 190. A wavelength and an intensity of the laser beam used may be determined depending on a thickness, a material, etc. of the passivation layer 190.

In the embodiment, if the rear electrodes 151 have a stripe shape, the exposing portions 181 may have a stripe shape extending in a fixed direction. The exposing portions 181 may be formed using various methods instead of the laser beam, such as by mechanically forming a hole or by etching.

Next, as shown in FIG. 4B, a paste containing Al is coated on the passivation layer 190 and the exposed portions of the substrate 110 using the screen printing method and then is dried. Then, as shown in FIG. 4C, a paste containing Ag is coated on the entire surface of the passivation layer 190 excluding a formation portion of the rear electrode conductive layer pattern 150 from the rear surface of the substrate 110 using the screen printing method to form a rear electrode current collector pattern 160. Then, the rear electrode current collector pattern 160 is dried. The rear electrode current collector pattern 160 partially overlaps the rear electrode conductive layer pattern 150. As described above, before the front electrode and front electrode current collector pattern 140 is formed, the rear electrode conductive layer pattern 150 may be formed.

Afterwards, a firing process is performed on the substrate 110, on which the patterns 140, 150, and 160 are formed, to form a plurality of front electrodes 141, a plurality of front electrode current collectors 142, a rear electrode conductive layer 155 including a plurality of rear electrodes 151 electrically connected to the exposed portions of the substrate 110, a plurality of rear electrode current collectors 162, and a plurality of BSF layers 170. As a result, the solar cell 1 shown in FIGS. 1 and 2 is completed.

Alternatively, the passivation layer 190 may be formed by sequentially forming the emitter layer 120 and the anti-reflection layer 130 on the substrate 110 and then by removing the emitter layer 120 formed on the rear surface of the substrate 110. After the plurality of exposing portions 181 are formed on the passivation layer 190, the front electrode and front electrode current collector pattern 140, the rear electrode conductive layer pattern 150, and the plurality of rear electrode current collector patterns 160 may be formed in proper order. Then, a thermal process may be performed on the substrate 110, on which the patterns 140, 150, and 160 are formed to complete the solar cell 1. In the embodiment, a formation order of the patterns 140, 150, and 160 may vary.

Figure 5:
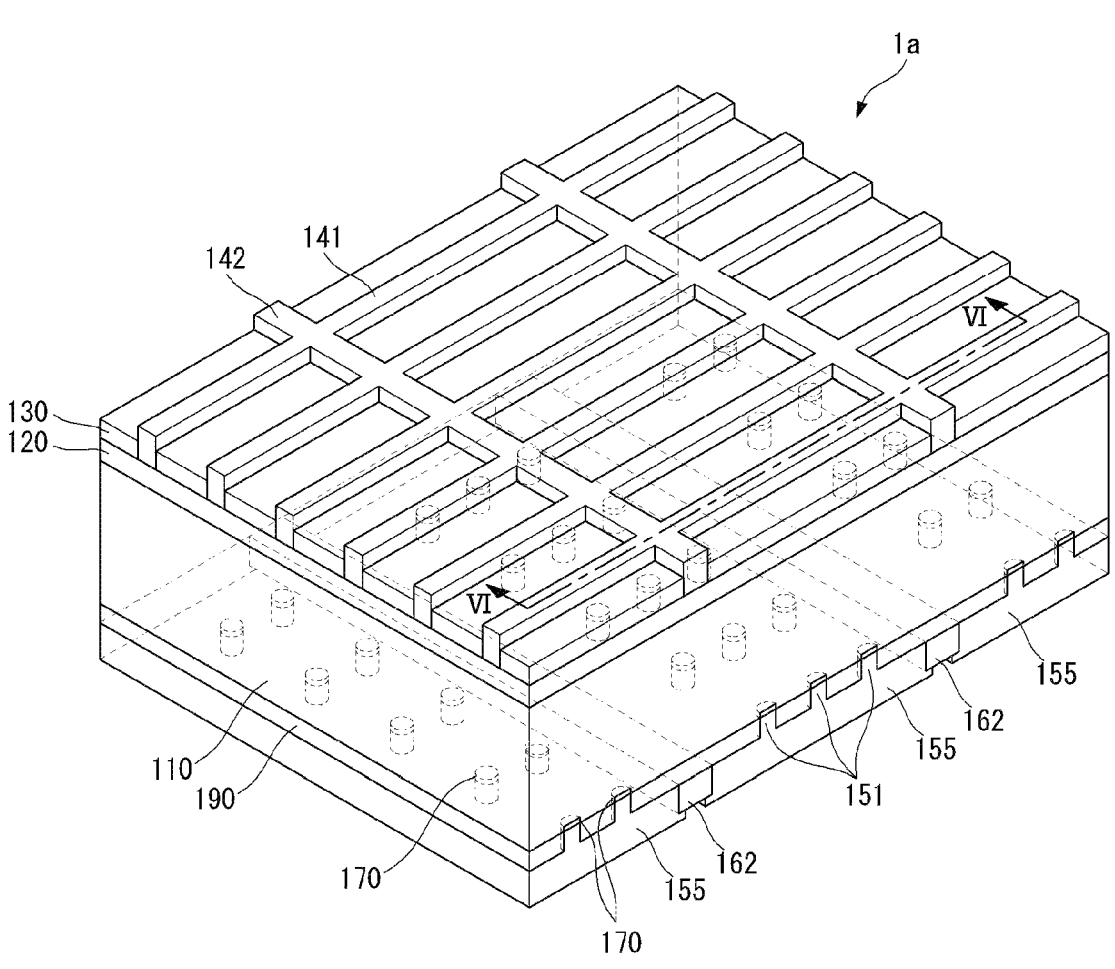
FIG. 5 is a partial perspective view of a solar cell according to an example embodiment.
Figure 6:
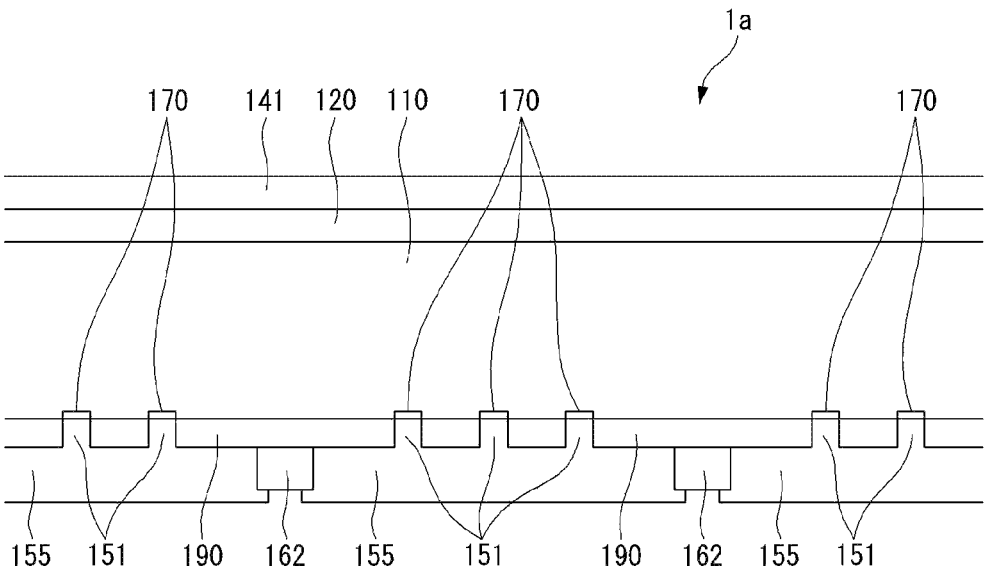
FIG. 6 is a cross-sectional view taken along line VI-VI of FIG. 5.

Another implementation of a solar cell according to an example embodiment is below described with reference to FIGS. 5 and 6. FIG. 5 is a partial perspective view of a solar cell according to an example embodiment. FIG. 6 is a cross-sectional view taken along line VI-VI of FIG. 5. In the following explanations, structural elements having the same functions and structures as those illustrated in FIGS. 1 and 2 are designated by the same reference numerals, and a further description may be briefly made or may be entirely omitted.

A solar cell 1a shown in FIGS. 5 and 6 has a similar configuration to the solar cell 1 shown in FIGS. 1 and 2. More specifically, as shown in FIGS. 5 and 6, the solar cell 1a includes a substrate 110, an emitter layer 120 on a front surface of the substrate 110, an anti-reflection layer 130 on the emitter layer 120, a passivation layer 190 on a rear surface of the substrate 110, a plurality of front electrodes 141 electrically connected to the emitter layer 120, a plurality of front electrode current collectors 142 connected to the plurality of front electrodes 141, a rear electrode conductive layer 155 that is positioned on the passivation layer 190 and includes a plurality of rear electrodes 151, a plurality of rear electrode current collectors 162 that are positioned on the passivation layer 190 and are electrically connected to the rear electrode conductive layer 155, and a plurality of back surface field (BSF) layers 170 between the substrate 110 and the plurality of rear electrodes 151.

However, unlike the solar cell 1 shown in FIGS. 1 and 2, in the solar cell 1a shown in FIGS. 5 and 6, a portion of the rear electrode conductive layer 155 is positioned on a portion of each of the rear electrode current collectors 162 and thus overlaps the portion. An overlap size between the rear electrode conductive layer 155 and the rear electrode current collector 162 is approximately 0.1 mm to 1 mm. Accordingly, a contact area between the rear electrode conductive layer 155 and the rear electrode current collector 162 transferring charges increases, and a charge transfer efficiency to the rear electrode current collector 162 is improved.

Further, because a portion of the rear electrode current collector 162 is formed under the rear electrode conductive layer 155, the rear electrode current collector 162 is protected by the rear electrode conductive layer 155. Thus, an adhesion between the rear electrode conductive layer 155 and the rear electrode current collector 162 increases.

In the embodiment, when the overlap size between the rear electrode conductive layer 155 and the rear electrode current collector 162 is greater than approximately 1 mm, a contact area between the rear electrode current collector 162 and an external device decreases because of a reduction in an exposed area of the rear electrode current collector 162. Thus, a charge transfer efficiency to the external device is reduced. Additionally, as shown in FIG. 5, a thickness of the rear electrode current collector 162 is lesser than a thickness of the rear electrode conductive layer 155 with respect to a bottom surface (the surface contacting the rear electrode current collector 162) of the passivation layer 190.

The solar cell 1a shown in FIGS. 5 and 6 may be manufactured using the methods of manufacturing the solar cell 1 illustrated in FIGS. 3A to 3H and FIGS. 4A to 4C, except a formation order of the rear electrode conductive layer pattern 150 and the rear electrode current collector pattern 160. More specifically, in the solar cell 1a, after the rear electrode current collector pattern 160 is formed, the rear electrode conductive layer pattern 150 is formed so as to partially overlap the rear electrode current collector pattern 160. Afterwards, the front electrode and front electrode current collector pattern 140 is formed. The substrate 110, on which the patterns 140, 150, and 160 are formed, is fired to form the plurality of front electrodes 141, the plurality of front electrode current collectors 142, the plurality of rear electrode current collectors 162, and the rear electrode conductive layer 155 that includes the plurality of rear electrodes 151 and partially overlaps the rear electrode current collectors 162.

In the embodiment, the plurality of BSF layers 170 are formed in a contact area between the rear electrodes 151 and the substrate 110 during a thermal process on the substrate 110 without performing a separate process. Alternatively, a plurality of impurity layers, that are doped with impurities of the same conductive type as the substrate 110 more heavily than the substrate 110, may be formed on the rear surface of the substrate 110 using a separate process. Here, the impurity layers may serve as the BSF layers 170. The plurality of impurity layers may be formed through the following process. For example, as shown in FIG. 4A, after a plurality of exposing portions 181 are formed on the passivation layer 190, impurities (for example, P-type impurities) of the same conductive type as the substrate 110 are injected into the rear surface of the substrate 110 using the passivation layer 190 as a mask through the CVD method to form the plurality of impurity layers.

An impurity doping concentration of each of the plurality of impurity layers may be greater than an impurity doping concentration of the substrate 110, and thus the plurality of impurity layers may be a P+-type layer. Afterwards, a front electrode and front electrode current collector pattern, a rear electrode conductive layer pattern, etc., may be formed, and a firing process may be performed on the substrate 110, on which the front electrode and front electrode current collector pattern, the rear electrode conductive layer pattern, etc., are formed. As a result, a solar cell may be completed.

Figure 7:
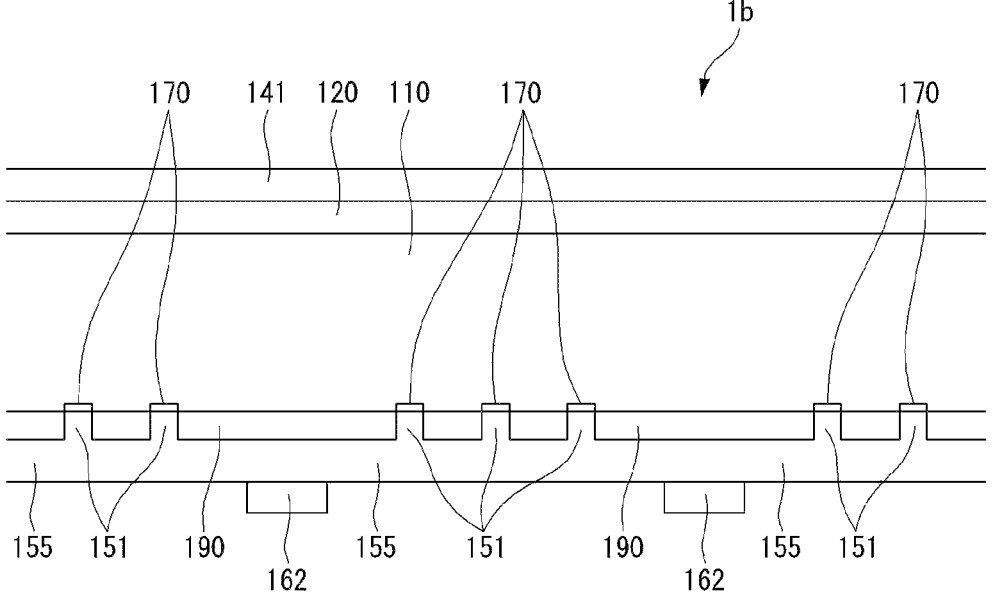
FIG. 7 is a cross-sectional view of a solar cell according to an example embodiment.

FIG. 7 is a cross-sectional view of another implementation of a solar cell according to an example embodiment. Since configuration of a solar cell 1b shown in FIG. 7 is substantially the same as the solar cell 1 shown in FIGS. 1 and 2, except that all of a plurality of rear electrode current collectors are positioned on a rear electrode conductive layer, a further description may be briefly made or may be entirely omitted.

In the solar cell 1 shown in FIGS. 1 and 2, the plurality of rear electrode current collectors 162 are positioned on a portion of the substrate 110 (i.e., a portion of the passivation layer 190). On the other hand, in the solar cell 1b shown in FIG. 7, a rear electrode conductive layer 155 is positioned on the entire surface of a substrate 110 (i.e., the entire surface of a passivation layer 190 or an exposed portion of the substrate 110 exposed by the passivation layer 190 and exposing portions 181), and a plurality of rear electrode current collectors 162 are positioned on a portion of the rear electrode conductive layer 155.

In manufacture of the solar cell 1b, because a rear electrode conductive layer pattern is formed and then a rear electrode current collector pattern is formed on the rear electrode conductive layer pattern, the rear electrode current collector pattern may be formed without difficulty in a location alignment between the rear electrode conductive layer pattern and the rear electrode current collector pattern. Hence, manufacturing time of the solar cell 1b can be reduced.

Each of the above solar cells 1, 1a, and 1b manufactured through various methods may be independently used. In addition, the plurality of solar cells 1, 1a, and 1b having the same structure may be connected in series to one another to form a solar cell module, so that the solar cells 1, 1a, and 1b are used more efficiently.

Figure 8:
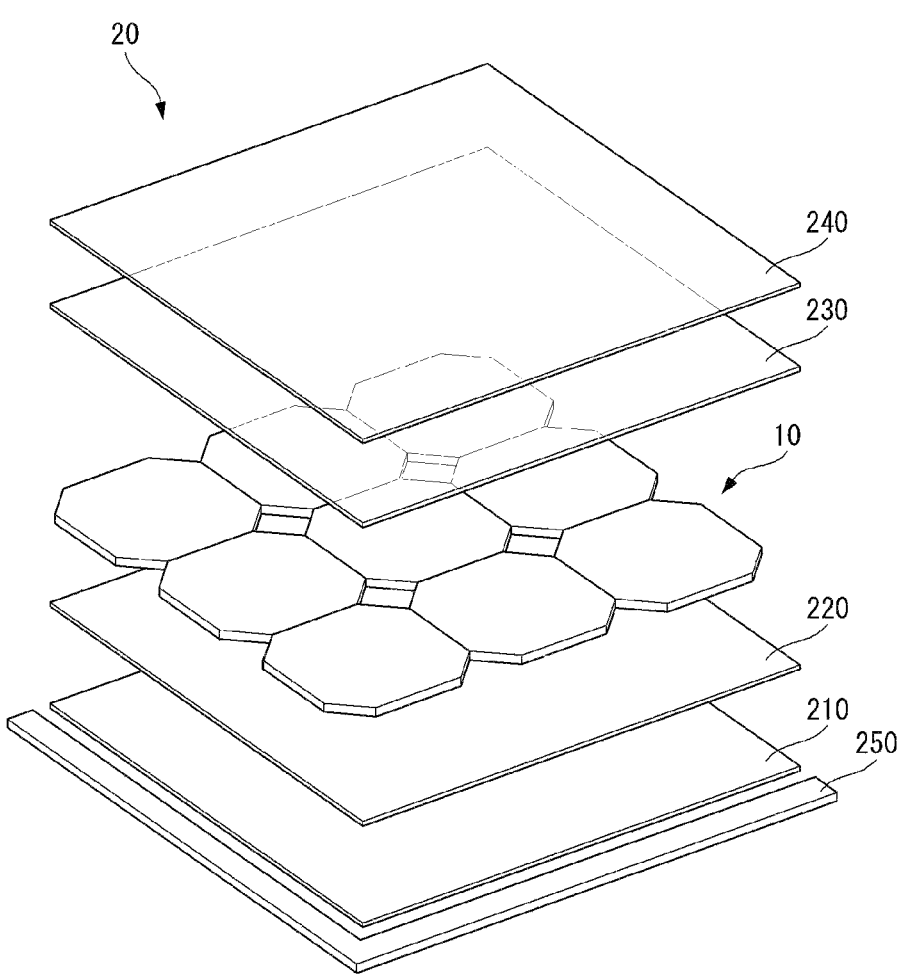
FIG. 8 schematically illustrates a solar cell module according to an example embodiment.
Figure 9:
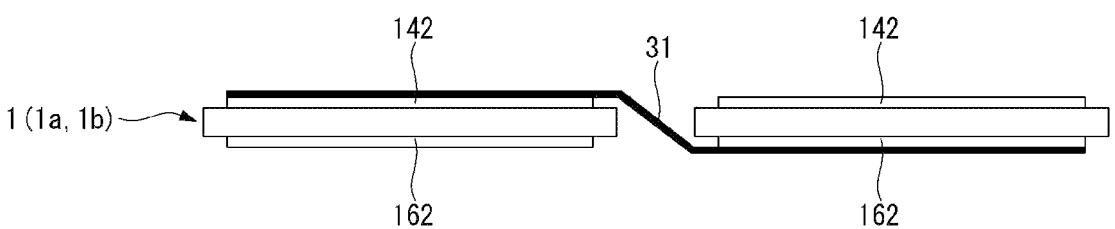
FIG. 9 is a cross-sectional view illustrating a connection state of a solar cell according to an example embodiment.

An example of a solar cell module according to an example embodiment is described below with reference to FIGS. 8 and 9. FIG. 8 schematically illustrates a solar cell module according to an example embodiment. FIG. 9 is a cross-sectional view illustrating a connection state of a solar cell according to an example embodiment.

As shown in FIG. 8, a solar cell module 20 according to an example embodiment includes a back sheet 210, a lower filling member 220 on the back sheet 210, a solar cell array 10 on the lower filling member 220, an upper filling member 230 on the solar cell array 10, a transparent member 240 on the upper filling member 230, and a frame 250 receiving the above components.

The back sheet 210 prevents moisture or oxygen from penetrating into a rear surface of the solar cell module 20 to protect solar cells 1, 1a, and 1b from an external environment. The back sheet 210 may have a multi-layered structure including a moisture/oxygen penetrating prevention layer, a chemical corrosion prevention layer, an insulation layer, etc.

The lower and upper filling members 220 and 230 reduce or prevent corrosion of metal resulting from the moisture penetration and are encapsulation members protecting the solar cell module 20 from an impact. The lower and upper filling members 220 and 230 may be formed of ethylene vinyl acetate (EVA). Other materials may be used.

The transparent member 240 on the upper filling member 230 is formed of a tempered glass having a high transmittance capable of reducing or preventing damage. The tempered glass may be a low iron tempered glass in which a Fe content is low. The transparent member 240 may have an embossed inner surface so as to increase a scattering effect of light.

The solar cell array 10 includes a plurality of solar cells 1, 1a, and 1b arranged in a matrix structure. The plurality of solar cells 1, 1a, and 1b are electrically connected in series or in parallel to one another. More specifically, as shown in FIG. 9, front electrode current collectors 142 and rear electrode current collectors 162 respectively positioned on and under or under and on each of the solar cells 1, 1a, and 1b are electrically connected to each other using conductive connecting units 31. In other words, the conductive connecting units 31 are positioned and fixed on the front electrode current collectors 142 and the rear electrode current collectors 162 respectively positioned on and under/under and on each of the solar cells 1, 1a, and 1b to thereby electrically connect the front electrode current collectors 142 to the rear electrode current collectors 162. The conductive connecting units 31 may be a conductive tape, corresponding to a thin metal plate band having a string form, formed of a conductive material called a ribbon. An adhesive is coated on each of the front and rear electrode current collectors 142 and 162, and then the conductive connecting units 31 are attached to each of the front and rear electrode current collectors 142 and 162, so that an adhesion efficiency between the conductive connecting units 31 and each of the front and rear electrode current collectors 142 and 162 increases.

As described above, because portions of the rear electrode current collectors 162 overlap a rear electrode conductive layer 155, areas of the rear electrode current collectors 162 exposed to the outside increase. Accordingly, contact operations between the rear electrode current collectors 162 and the conductive connecting units 31 are easily performed, and a contact resistance decreases. Hence, the contact efficiency is improved, and a charge transfer efficiency is improved.

Figure 10:
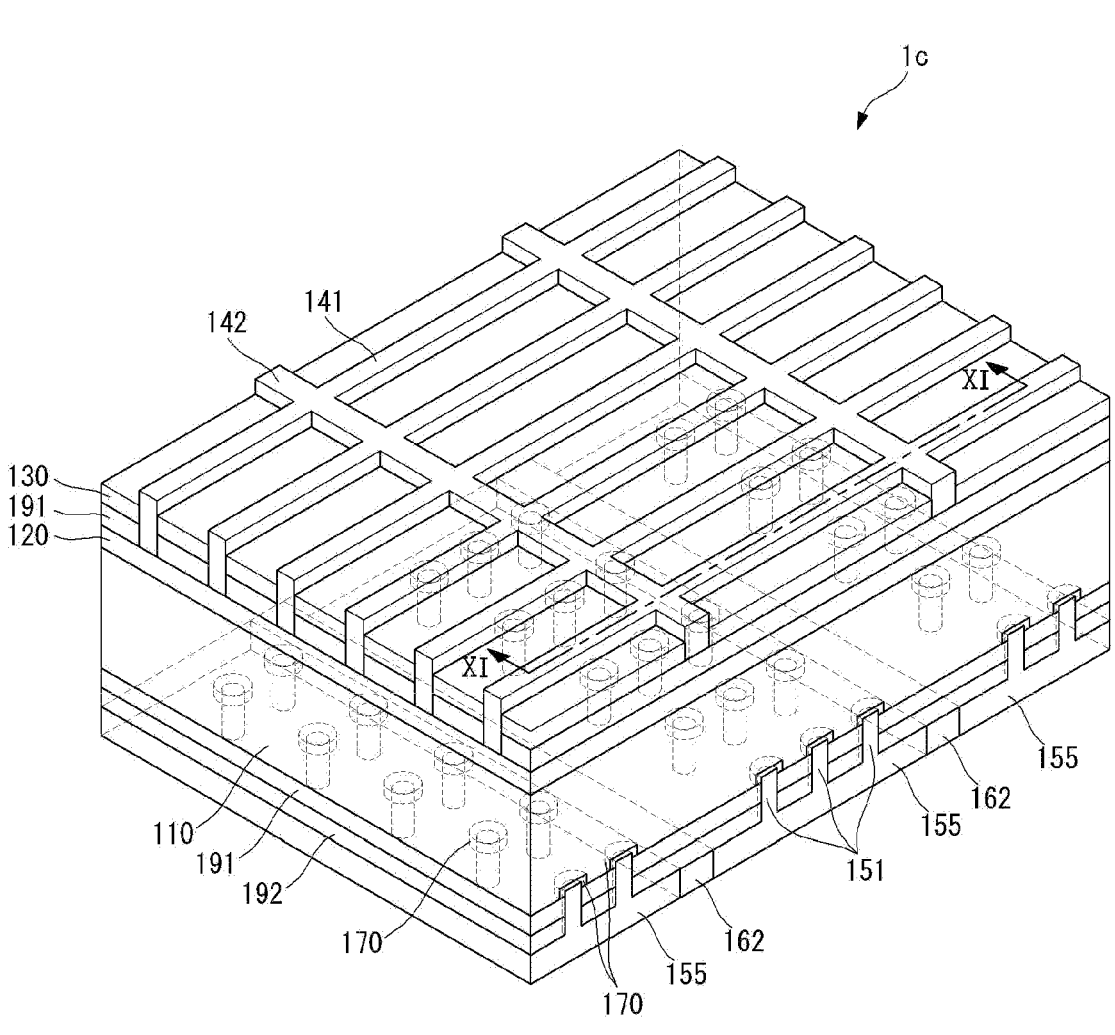
FIG. 10 is a partial perspective view of a solar cell according to an example embodiment.
Figure 11:
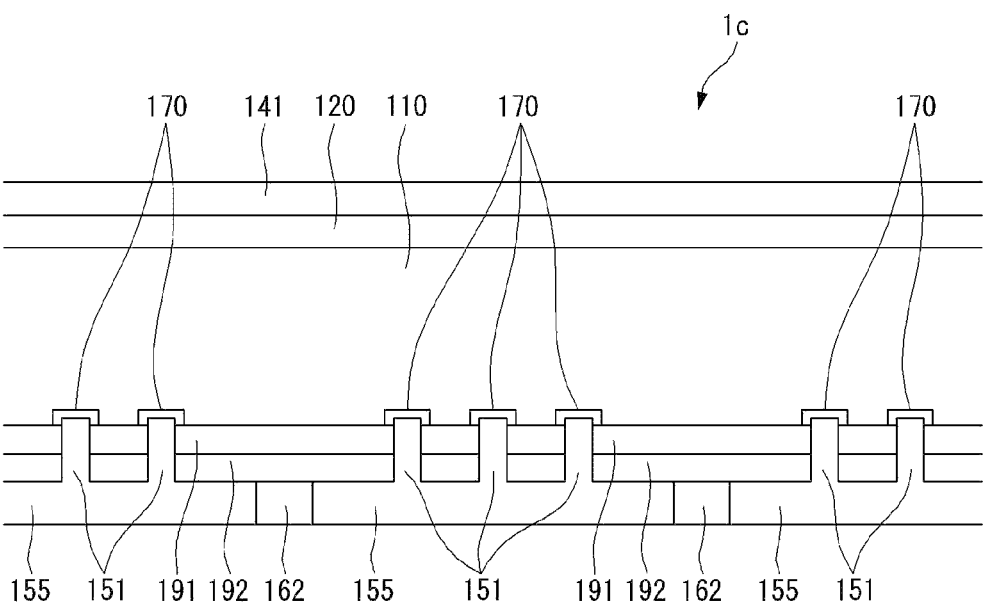
FIG. 11 is a cross-sectional view taken along line XI-XI of FIG. 10.

Another implementation of a solar cell according to an example embodiment is below described with reference to FIGS. 10 and 11. FIG. 10 is a partial perspective view of a solar cell according to an example embodiment. FIG. 11 is a cross-sectional view taken along line XI-XI of FIG. 10. In the following explanations, structural elements having the same functions and structures as those illustrated in FIGS. 1, 2, 5, 6, and 9 are designated by the same reference numerals, and a further description may be briefly made or may be entirely omitted.

A solar cell 1c shown in FIGS. 10 and 11 has a similar configuration to the solar cells shown in FIGS. 1, 2, 5, 6, and 9. More specifically, as shown in FIGS. 10 and 11, the solar cell 1c includes a substrate 110, an emitter layer 120 on a front surface of the substrate 110, an anti-reflection layer 130 on the emitter layer 120, a plurality of front electrodes 141 electrically connected to the emitter layer 120, a plurality of front electrode current collectors 142 connected to the plurality of front electrodes 141, a rear electrode conductive layer 155 including a plurality of rear electrodes 151, a plurality of rear electrode current collectors 162 electrically connected to the rear electrode conductive layer 155, and a plurality of back surface field (BSF) layers 170 between the substrate 110 and the plurality of rear electrodes 151.

However, unlike the solar cells shown in FIGS. 1, 2, 5, 6, and 9, in the solar cell 1c shown in FIGS. 10 and 11, a passivation layer 191 is positioned on the emitter layer 120 positioned on the front surface and a side surface as well as a rear surface of the substrate 110. In other words, the passivation layer 191 is positioned on the entire surface of the substrate 110 and is positioned between the emitter layer 120 and the anti-reflection layer 130. The passivation layer 191 reduces a recombination of charges around the surface of the emitter layer 120 as well as around the surface of the substrate 110. The passivation layer 191 may be formed of silicon oxide ($SiO_x$) corresponding to a thermal oxide material and may have a thickness of approximately 10 nm to 50 nm.

Accordingly, the passivation layer 191 having excellent characteristics converts unstable bonds, like a dangling bond, existing around the surface of the substrate 110 into stable bonds to reduce a recombination and/or a disappearance of charges (for example, holes) moving to the substrate 110 resulting from the unstable bonds.

Further, the solar cell 1c shown in FIGS. 10 and 11 further includes an auxiliary passivation layer 192 positioned on the passivation layer 191 on the rear surface of the substrate 110. Thus, in the solar cell 1c, the rear electrode conductive layer 155 and the plurality of rear electrode current collectors 162 are positioned on the auxiliary passivation layer 192.

The auxiliary passivation layer 192 formed of silicon nitride (SiNx) again converts the unstable bond, that is not converted into the stable bond by the passivation layer 191, into a stable bond to reduce a recombination and/or a disappearance of charges around the surface of the substrate 110. The auxiliary passivation layer 192 increases an inner reflectance of light passing through the substrate 110 to increase re-incidence of the light passing through the substrate 110. Accordingly, in the solar cell 1c shown in FIGS. 10 and 11, the passivation layer 191 and the auxiliary passivation layer 192 positioned on the rear surface of the substrate 110 serve as a rear passivation layer.

As described above, when the passivation layer 191 and the auxiliary passivation layer 192 are positioned on the rear surface of the substrate 110, the plurality of rear electrodes 151 of the rear electrode conductive layer 155 pass through the passivation layer 191 and the auxiliary passivation layer 192 and are electrically connected to a portion of the substrate 110.

Further, in the solar cell 1c, a portion of each of the plurality of rear electrodes 151 contacting the substrate 110 may contain only the same components as the rear electrode conductive layer 155 or may contain a mixture of components of the passivation layer 191, the auxiliary passivation layer 192, and the substrate 110 as well as components contained in the rear electrode conductive layer 155.

As shown in FIGS. 10 and 11, the rear electrode conductive layer 155 and the rear electrode current collectors 162 do not overlap each other and are positioned on the same level layer (i.e., coplanar or flush relative to each other). Also, the rear electrode conductive layer 155 and the rear electrode current collectors 162 may be the same level layer as being formed on the auxiliary passivation layer 192, but have different thicknesses, such that the exposed surfaces of the rear electrode conductive layer 155 and the rear electrode current collectors 162 are not coplanar, and the respective thicknesses relative to the auxiliary passivation layer 192 are different. Hence, material cost of the rear electrode conductive layer 155 or the rear electrode current collectors 162 may be reduced. The above location relationship between the rear electrode conductive layer 155 or the rear electrode current collectors 162 may be applied to the solar cells shown in FIGS. 1, 2, 5, and 6.

As described above, because the solar cell 1c includes a front passivation layer and a rear passivation layer respectively positioned on the front and rear surfaces of the substrate 110, unstable bonds, like a dangling bond, existing around the emitter layer 120 and the substrate 110 are converted into stable bonds and a surface state of each of the emitter layer 120 and the substrate 110 changes into an inactive state. Accordingly, a recombination and/or a disappearance of electrons and holes moving to the emitter layer 120 and the substrate 110 resulting from the unstable bonds is greatly reduced, and an operation efficiency of the solar cell 1c is greatly improved.

Figure 14:
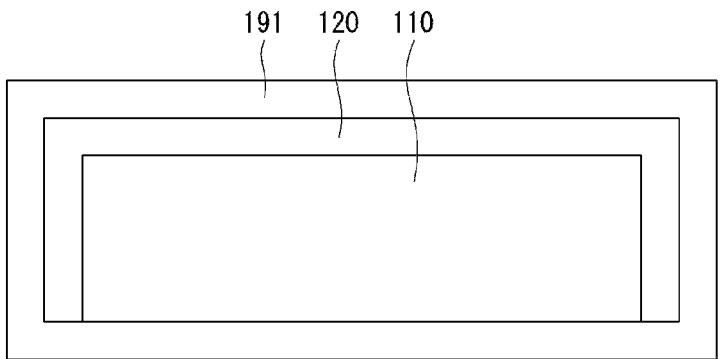
FIG. 14 is a cross-sectional view of a substrate on which a passivation layer is formed in a solar cell according to an example embodiment.

Another implementation of a method of manufacturing a solar cell according to an example embodiment is below described with reference to FIGS. 12A to 12H and FIG. 14. FIGS. 12A to 12H are cross-sectional views sequentially illustrating each of stages in a method of manufacturing a solar cell according to an example embodiment. FIG. 14 is a cross-sectional view of a substrate on which a passivation layer is formed in a solar cell according to an example embodiment.

Figure 12A:
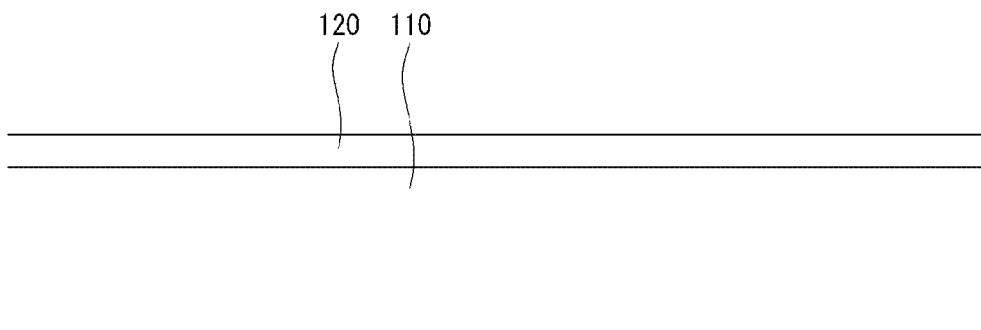
FIGS. 12A to 12H are cross-sectional views sequentially illustrating each of stages in a method of manufacturing a solar cell according to an example embodiment.

As shown in FIG. 12A, a material (for example, $POCl_3$ or $H_3PO_4$) containing impurities of a group V element such as P, As, and Sb is coated on a substrate 110 formed of p-type single crystal silicon or p-type polycrystalline silicon using a spin coating method or a spraying method. Then, a thermal process is performed on the coated material at a high temperature of about 800° C. to 1,000° C. to distribute the group V element impurities on the front surface and the side surface of the substrate 110. Hence, an emitter layer 120 is formed on the front surface and the side surface of the substrate 110. Unlike the embodiment, when the substrate 110 is of an n-type, a material (for example, $B_2H_6$) containing group III element impurities is coated on the substrate 110 using the spin coating method or the spraying method, and then a high temperature thermal process is performed on the coated material to form the p-type emitter layer 120 on the front surface and the side surface of the substrate 110. Subsequently, phosphorous silicate glass (PSG) containing phosphor (P) or boron silicate glass (BSG) containing boron (B) produced when p-type impurities or n-type impurities are distributed inside the substrate 110 is removed through an etching process.

As described above, if necessary, before the emitter layer 120 is formed, a texturing process may be performed on the entire surface of the substrate 110 to form a textured surface of the substrate 110.

Figure 12B:
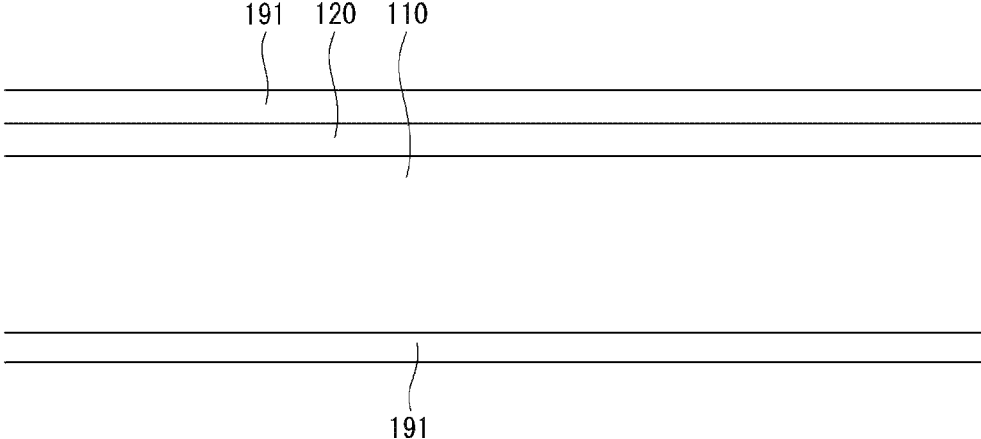

As shown in FIG. 12B, oxygen ($O_2$) is injected into a reaction chamber and then is processed at a high temperature to grow a thermal oxide layer ($SiO_2$) on the emitter layer 120 and on a rear surface of the substrate 110, on which the emitter layer 120 is not formed, using a thermal oxidation method. Hence, a passivation layer 191 corresponding to the thermal oxide layer is formed. In addition, as shown in FIG. 14, the passivation layer 191 is formed on the substantially entire surface of the substrate 110. A thickness of the passivation layer 191 is approximately 10 nm to 50 nm. As described above, because the emitter layer 120 is formed on the front surface and the side surface of the substrate 110 except the rear surface of the substrate 110, the passivation layer 191 may be formed on the substantially entire surface of the substrate 110 without a process for removing the emitter layer 120 on the rear surface of the substrate 110. Hence, the process for removing the emitter layer 120 on the rear surface of the substrate 110 is not necessary, and the passivation layer 191 may be simultaneously formed on the front surface and the rear surface of the substrate 110. Hence, the method of manufacturing the solar cell can be simplified, and manufacturing time can be reduced.

Figure 12C:
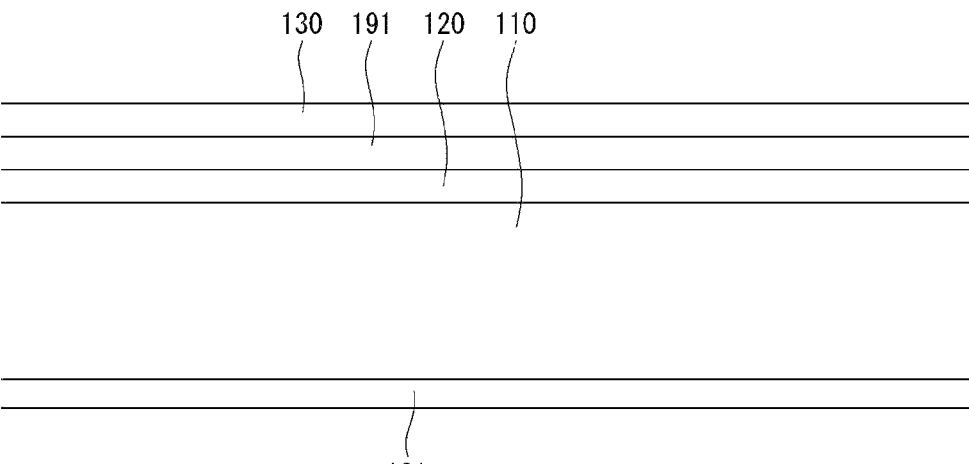
Figure 12D:
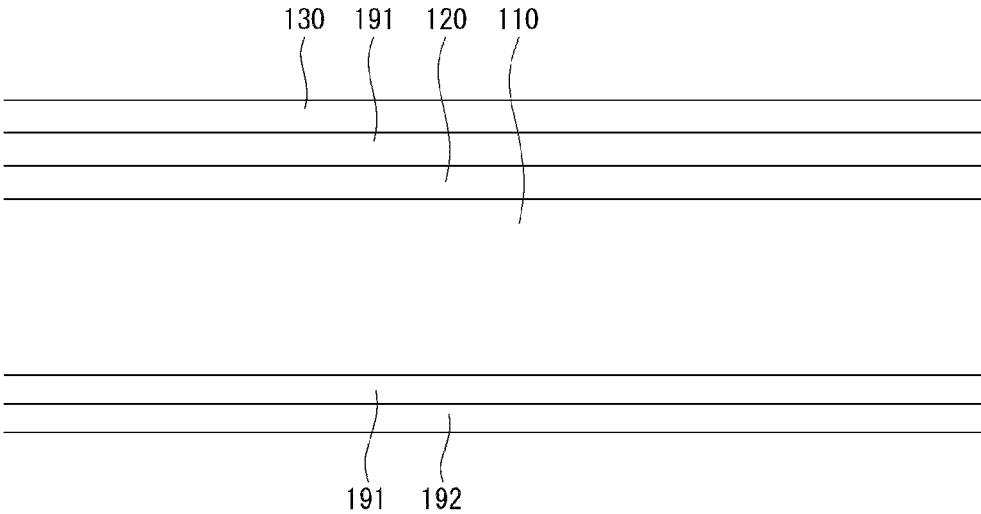

As shown in FIG. 12C, an anti-reflection layer 130 formed of silicon nitride (SiNx) is formed on the passivation layer 191 formed on the entire surface of the substrate 110 using a CVD method such as a PECVD method. As shown in FIG. 12D, an auxiliary passivation layer 192 formed of silicon nitride (SiNx) is formed on the passivation layer 191 formed on the rear surface of the substrate 110 using the CVD method such as the PECVD method. In the embodiment, a formation order of the anti-reflection layer 130 and the auxiliary passivation layer 192 may vary.

Figure 12E:
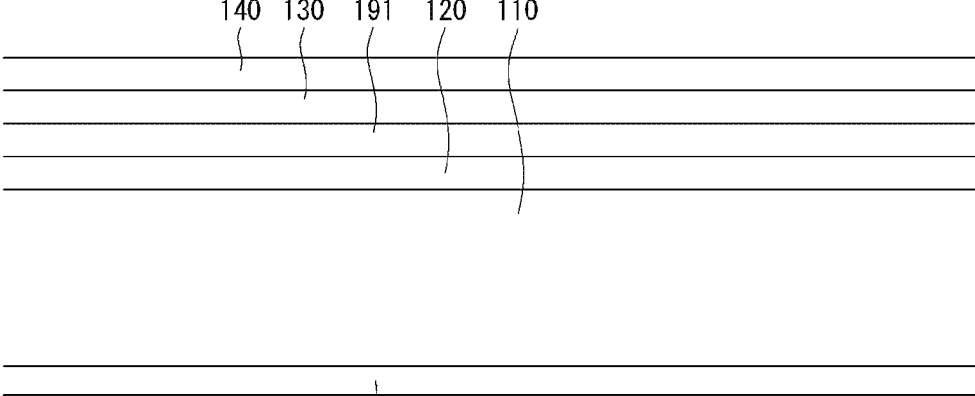
Figure 12F:
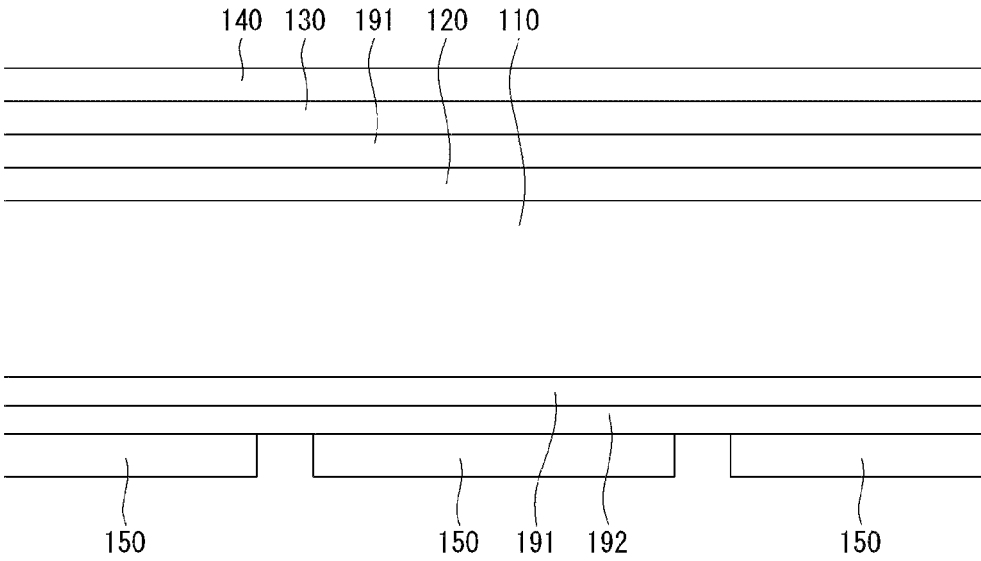
Figure 12G:
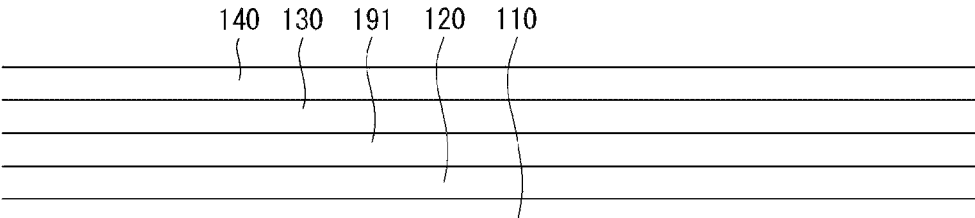
Figure 12G:
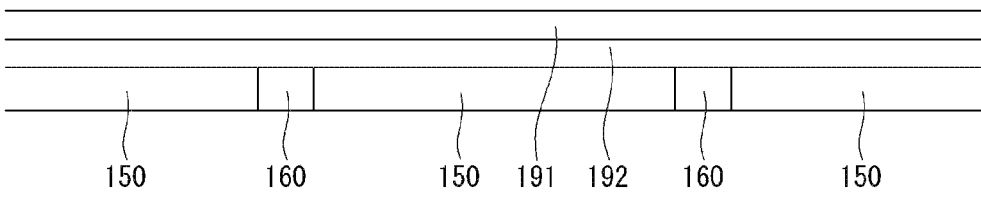

As shown in FIGS. 12E to 12G, in the same manner as FIGS. 3E to 3G, a front electrode and front electrode current collector pattern 140 is formed on a corresponding portion of the anti-reflection layer 130, and a rear electrode conductive layer pattern 150 and a rear electrode current collector pattern 160 are formed on a corresponding portion of the auxiliary passivation layer 192. As described above, a formation order of the patterns 140, 150, and 160 may vary.

Figure 12H:
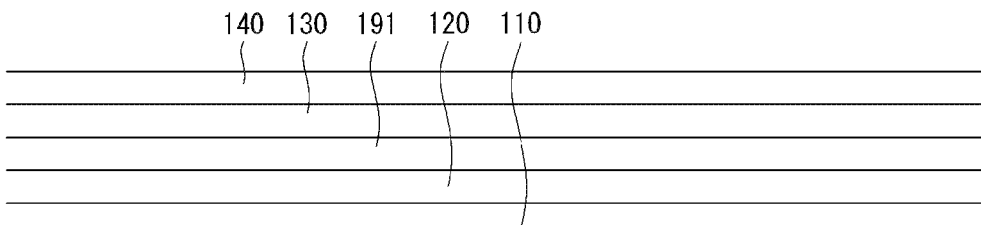
Figure 12H:
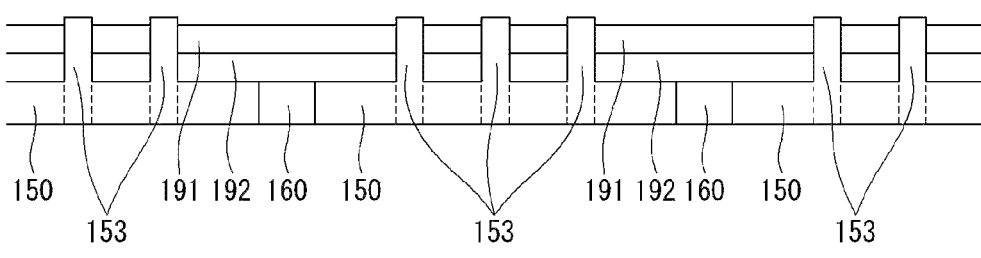

As shown in FIG. 12H, a laser beam is irradiated onto a fixed portion of the rear electrode conductive layer pattern 150 to form a rear electrode portion 153 corresponding to a molten mixture of components of the rear electrode conductive layer pattern 150, the passivation layer 191, the auxiliary passivation layer 192, and the substrate 110. Then, a firing process is performed on the substrate 110, on which the patterns 140, 150, and 160 are formed, to form the passivation layer 191, a plurality of front electrodes 141, a plurality of front electrode current collectors 142, a rear electrode conductive layer 155 including a plurality of rear electrodes 151, a plurality of rear electrode current collectors 162, and a plurality of BSF layers 170. As a result, the solar cell (for example, the solar cell 1c shown in FIGS. 10 and 11) is completed.

A wavelength and an intensity of the laser beam used may be determined depending on a thickness, a material, etc., of the rear electrode conductive layer pattern 150, the passivation layer 191, and the auxiliary passivation layer 192. Because the emitter layer 120 is formed on the front surface and the side surface of the substrate 110 in the manufacturing method illustrated in FIGS. 12A to 12H and FIG. 14, a separate edge isolation process for removing the emitter layer 120 on the rear surface of the substrate 110 is not necessary.

Further, because the passivation layer 191 is formed using the thermal oxide layer ($SiO_2$) having the excellent characteristics, a conversion efficiency of unstable bonds into stable bonds is very good. Furthermore, the unstable bond, that is not converted into the stable bond, is again converted into the stable bond by the anti-reflection layer 130 formed of silicon nitride (SiNx) or the auxiliary passivation layer 192 formed of silicon nitride (SiNx) because of the thin passivation layer 191 of about 10 nm to 50 nm. In other words, a recombination of charges resulting from the unstable bonds is greatly reduced by a front passivation layer of a two-layered structure including the passivation layer 191 and the anti-reflection layer 130 or a rear passivation layer of a two-layered structure including the passivation layer 191 and the auxiliary passivation layer 192. Further, because the passivation layer 191 is formed on the front surface as well as the rear surface of the substrate 110, a reduction in an operation efficiency of the solar cell resulting from the recombination of charges is greatly reduced. Furthermore, because the thickness of the passivation layer 191 is very thin, much time required to grow the thermal oxide layer is not necessary. Thus, the production efficiency of the solar cell is improved.

The solar cell manufactured using the method illustrated in FIGS. 12A to 1211 and FIG. 14 may be manufactured using the method illustrated in FIGS. 4A to 4C described above.

Figure 13A:
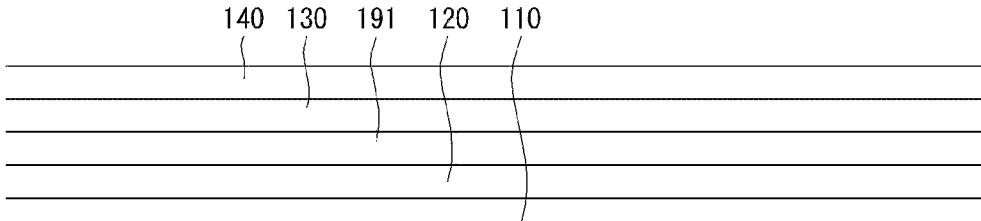
FIGS. 13A to 13C are cross-sectional views sequentially illustrating each of stages in another method of manufacturing a solar cell according to an example embodiment.
Figure 13A:
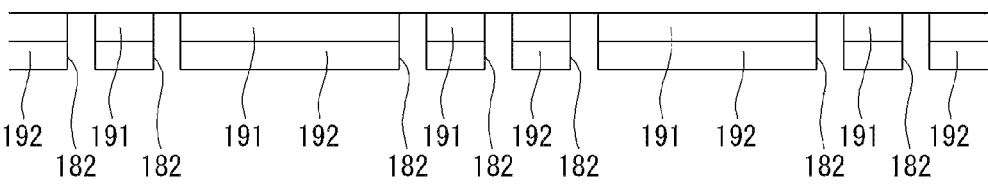
Figure 13B:
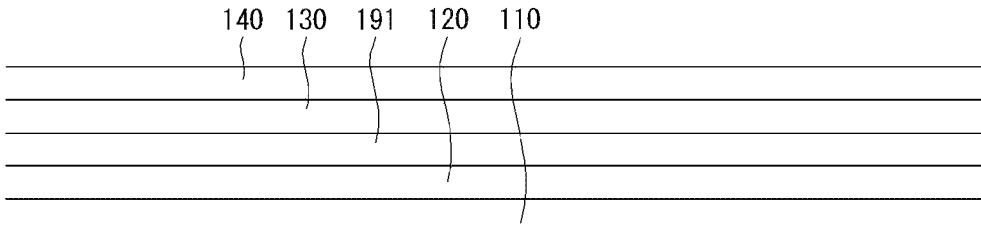
Figure 13B:
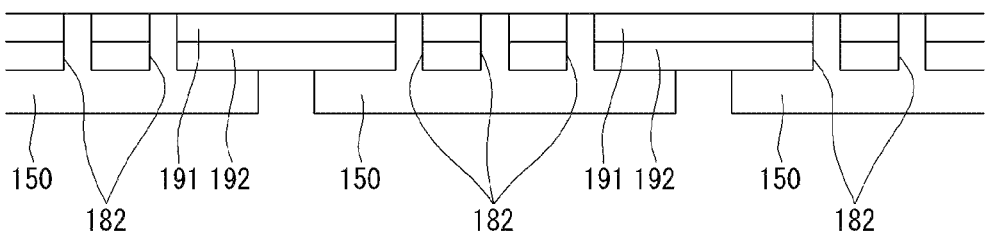
Figure 13C:
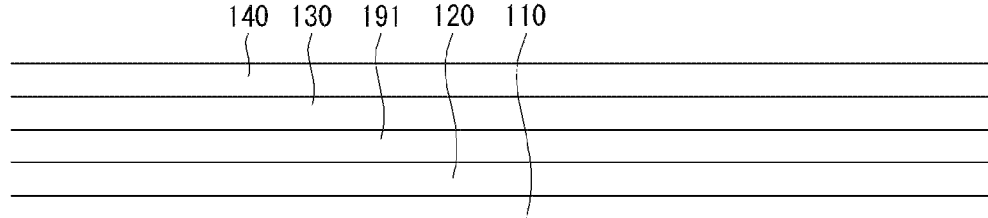
Figure 13C:
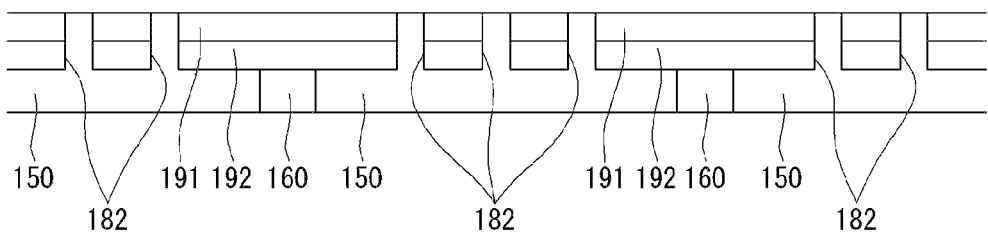

FIGS. 13A to 13C are cross-sectional views sequentially illustrating each of stages in another method of manufacturing a solar cell according to an example embodiment. As already shown in FIGS. 3A to 3E, the emitter layer 120 is formed on the front surface and the side surface of the substrate 110, the passivation layer 191 formed of a thermal oxide layer is formed on the emitter layer 120 and on the rear surface of the substrate 110, the anti-reflection layer 130 formed of silicon nitride (SiNx) is formed on the passivation layer 191 formed on the front surface of the substrate 110, the auxiliary passivation layer 192 formed of silicon nitride (SiNx) is formed on the passivation layer 191 formed on the rear surface of the substrate 110, and the front electrode and front electrode current collector pattern 140 are formed on the anti-reflection layer 130 on the front surface of the substrate 110 using a paste containing Ag.

Next, a laser beam, as shown in FIG. 4A, is irradiated onto a corresponding portion of each of the passivation layer 191 and the auxiliary passivation layer 192 to form a plurality of exposing portions of the substrate 110 on each of the passivation layer 191 and the auxiliary passivation layer 192, as shown in FIG. 13A. A wavelength and an intensity of the laser beam used may be determined depending on a thickness, a material, etc., of the passivation layer 191 and the auxiliary passivation layer 192.

If the plurality of rear electrodes 151 have a stripe shape, the exposing portions 182 may have a stripe shape extending in a fixed direction. The plurality of exposing portions 182 may be formed in various manners instead of the laser beam.

Next, a paste containing Al, as shown in FIG. 4B, is coated on the auxiliary passivation layer 192 and the exposed portions of the substrate 110 using the screen printing method to the rear electrode conductive layer pattern 150. Then, the rear electrode conductive layer pattern 150 is dried as shown in FIG. 13B. Next, a paste containing Ag, as shown in FIG. 4C, is coated on the auxiliary passivation layer 192 excluding a formation portion of the rear electrode conductive layer pattern 150 at the rear surface of the substrate 110 using the screen printing method to form the rear electrode current collector pattern 160. Then, the rear electrode current collector pattern 160 is dried as shown in FIG. 13C. As described above, a formation order of the patterns 140, 150, and 160 may vary.

Next, a firing process is performed on the substrate 110, on which the patterns 140, 150, and 160 are formed, to form a plurality of front electrodes 141, a plurality of front electrode current collectors 142, a rear electrode conductive layer 155 including a plurality of rear electrodes 151 electrically connected to the substrate 110 through the exposing portions 181, a plurality of rear electrode current collectors 162, and a plurality of BSF layers 170. As a result, the solar cell (for example, the solar cell 1c shown in FIGS. 10 and 11) is completed.

In the embodiment, because the passivation layer 191 is formed using the thermal oxide layer (SiO$_2$) having the excellent conversion efficiency, the recombination of charges resulting from the unstable bonds is greatly reduced. Further, because the passivation layer 191 is formed on the front surface as well as the rear surface of the substrate 110, the recombination of charges is further reduced. Furthermore, because the anti-reflection layer 120 on the front surface of the substrate 110 and the auxiliary passivation layer 191 on the rear surface of the substrate 110 are formed of silicon nitride (SiNx) converting the instable bonds into the stable bonds, the recombination of charges is further reduced. Accordingly, the efficiency of the solar cell is greatly improved.

In embodiments of the invention, reference to front or back, with respect to electrode, a surface of the substrate, or others is not limiting. For example, such a reference is for convenience of description since front or back is easily understood as examples of first or second of the electrode, the surface of the substrate or others.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A method of manufacturing a solar cell, comprising:
   providing a substrate of a first conductive type;
   forming an emitter layer of a second conductive type opposite the first conductive type on a front surface and a rear surface of the substrate and removing the emitter layer on the rear surface of the substrate;
   forming an anti-reflection layer on the emitter layer on the front surface;
   forming a rear passivation layer on the rear surface of the substrate;
   coating a first paste on the anti-reflection layer to form a front electrode and front electrode current collector pattern;
   coating a second paste that includes a metal on the rear passivation layer to form a rear electrode conductive pattern having a plurality of openings on the rear passivation layer, wherein the plurality of openings expose the rear passivation layer;
   coating a third paste on the rear passivation layer that is exposed by the plurality of openings of the rear electrode conductive pattern to form a plurality of rear electrode current collector patterns;
   irradiating a laser beam onto one or more portions of the rear electrode conductive pattern to form a molten mixture of material of the second paste that includes a metal, material of the rear passivation layer, and material of the substrate at the one or more portions of the rear electrode conductive pattern, wherein, in a plan view, the one or more portions of the rear electrode conductive pattern that is irradiated do not overlap the plurality of rear electrode current collector patterns; and
   performing a firing process on the front electrode and front electrode current collector pattern, the rear electrode conductive pattern, the molten mixture, and the plurality of rear electrode current collector patterns,
   wherein, as a result of the firing process, the front electrode and front electrode current collector pattern are converted to a plurality of first electrodes and a plurality of front electrode current collectors, the rear electrode conductive pattern is converted to a rear electrode conductive layer, the molten mixture is converted to a plurality of rear electrodes and a plurality of back surface field layers, the plurality of rear electrodes are located between the rear electrode conductive layer and the plurality of back surface field layers, and the plurality of rear electrode current collector patterns are converted to a plurality of rear electrode current collectors, and wherein the firing process simultaneously forms the rear electrode conductive layer, the plurality of rear electrodes, the plurality of back surface field layers, and the plurality of rear electrode current collectors.

2. The method of claim 1, wherein the first paste and the third paste both contain silver (Ag), and the second paste contains aluminum (Al).

3. The method of claim 2, wherein the front electrode and front electrode current collector pattern further contains lead (Pb), whereas the rear electrode conductive pattern and the plurality of rear electrode current collector patterns do not contain Pb.

4. The method of claim 1, wherein the first paste, the second paste, and the third paste are coated using a screen printing method and then are dried to form the front electrode and front electrode current collector pattern, the rear electrode conductive pattern, and the plurality of rear electrode current collector patterns, respectively.

5. The method of claim 4, wherein the first paste, the second paste, and the third paste are dried at a temperature lower than a temperature of the firing process.

6. The method of claim 1, wherein a temperature of the firing process is about 750° C. to 800° C.

7. The method of claim 1, wherein the front electrode and front electrode current collector pattern is spaced apart from the emitter layer by the anti-reflection layer before the firing process, and the plurality of first electrodes and the plurality of front electrode current collectors pass through the anti-reflection layer and in direct contact with the emitter layer after the firing process.

8. The method of claim 7, wherein the plurality of rear electrode current collector patterns are spaced apart from the substrate by the rear passivation layer before the firing process, and the plurality of rear electrode current collectors are spaced apart from the substrate by the rear passivation layer after the firing process.

9. The method of claim 7, wherein a portion of the rear electrode conductive pattern that excludes the molten mixture is spaced apart from the substrate by the rear passivation layer before the firing process, and a portion of the rear electrode conductive layer that excludes the plurality of rear electrodes is spaced apart from the substrate by the rear passivation layer after the firing process.

10. The method of claim 1, wherein an entire front surface of the plurality of rear electrode current collectors are in direct contact with a rear surface of the rear passivation layer.

11. The method of claim 1, wherein the third paste is further coated on a portion of the rear electrode conductive pattern, and, after the firing process, an overlapped width of the rear electrode conductive layer and each rear electrode current collector of the plurality of rear electrode current collectors is approximately 0.1 mm to 1 mm.

12. The method of claim 1, wherein the plurality of back surface field layers are spaced apart from each other, and the plurality of rear electrodes are spaced apart from each other and the plurality of rear electrodes are physically connected to the rear electrode conductive layer.

13. The method of claim 12, wherein the plurality of rear electrodes are arranged in rows, and each first electrode has a stripe shape and overlaps a row of rear electrodes.

14. The method of claim 1, wherein, in the plan view, the plurality of rear electrodes do not overlap the plurality of rear electrode current collectors.

* * * * *